US012616025B2

(12) United States Patent
Chen et al.

(10) Patent No.: US 12,616,025 B2
(45) Date of Patent: Apr. 28, 2026

(54) SEMICONDUCTOR PACKAGE FIXTURE AND METHODS OF MANUFACTURING

(71) Applicant: Taiwan Semiconductor Manufacturing Company, Ltd., Hsinchu (TW)

(72) Inventors: Chih-Hao Chen, Taipei City (TW); Li-Hui Cheng, New Taipei City (TW); Ying-Ching Shih, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 560 days.

(21) Appl. No.: 18/154,329

(22) Filed: Jan. 13, 2023

(65) Prior Publication Data

US 2024/0096732 A1 Mar. 21, 2024

Related U.S. Application Data

(60) Provisional application No. 63/376,333, filed on Sep. 20, 2022.

(51) Int. Cl.
H01L 23/367 (2006.01)
H01L 23/00 (2006.01)
(Continued)

(52) U.S. Cl.
CPC .... H01L 23/3675 (2013.01); H01L 23/49833 (2013.01); H01L 24/29 (2013.01); H01L 24/32 (2013.01); H01L 24/83 (2013.01); H01L 25/105 (2013.01); H10B 80/00 (2023.02); *H01L 24/73* (2013.01); *H01L 2224/29109* (2013.01); *H01L 2224/29111* (2013.01); *H01L 2224/29113* (2013.01); *H01L 2224/29118*

(2013.01); *H01L 2224/29139* (2013.01); *H01L 2224/29144* (2013.01); *H01L 2224/29193* (2013.01); *H01L 2224/32221* (2013.01);
(Continued)

(58) Field of Classification Search
CPC ........... H01L 23/3675; H01L 23/49833; H01L 24/29; H01L 24/32; H01L 24/83; H01L 25/105; H10B 80/00
USPC ........................................................ 257/680
See application file for complete search history.

(56) References Cited

U.S. PATENT DOCUMENTS 9,771,259 B2 9/2017 Liu
11,152,330 B2 * 10/2021 Li ........................ H01L 25/0652
2009/0057884 A1 3/2009 Too et al.

FOREIGN PATENT DOCUMENTS

CN 104803346 B 3/2018

* cited by examiner

*Primary Examiner* — Jasmine J Clark
(74) *Attorney, Agent, or Firm* — Harrity & Harrity, LLP

(57) ABSTRACT

Some implementations described herein provide techniques and apparatuses for a fixture including a semiconductor die package and methods of formation. The semiconductor die package is mounted to an interposer. In addition to the semiconductor die package, the fixture includes a lid component having a top structure and footing structures that connect the lid component to the interposer. The fixture includes a thermal interface material between a top surface of the semiconductor die package and the top structure of the lid component. The footing structures, connected to the interposer using deposits of an epoxy material, provide increase a structural rigidity of the fixture relative to another fixture not including the footing structures.

20 Claims, 20 Drawing Sheets

(51) Int. Cl.
    *H01L 23/498*         (2006.01)
    *H01L 25/10*          (2006.01)
    *H10B 80/00*         (2023.01)

(52) U.S. Cl.
    CPC ............... *H01L 2224/73253* (2013.01); *H01L 2225/1023* (2013.01); *H01L 2225/1058* (2013.01); *H01L 2225/1094* (2013.01)

900

910

920

930

940

950

960

1000

1010 — Form a footing structure of a lid component

1020 — Mount a semiconductor die package including an optical connector to an interposer 1030 — Attach the footing structure to the interposer

SEMICONDUCTOR PACKAGE FIXTURE AND METHODS OF MANUFACTURING

This Patent Application claims priority to Provisional Patent Application No. 63/376,333 filed on Sep. 20, 2022, and entitled "Semiconductor Package Fixture and Methods Manufacturing". The disclosure of the prior application is considered part of and is incorporated by reference into this patent application.

BACKGROUND

A high performance computing (HPC) semiconductor die package may include one or more integrated circuit (IC) dies, or chips, from a semiconductor wafer, such as a system-on-chip (SoC) IC die or a dynamic random access memory (DRAM) IC die. In some implementations, a fixture (e.g., a socket, a shell, or another structure, among other examples) interfaces the HPC semiconductor die package to a host system. To dissipate heat from one or more of the IC dies, a thermal interface material (TIM) may be located between the one or more IC dies and a lid component of the fixture.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
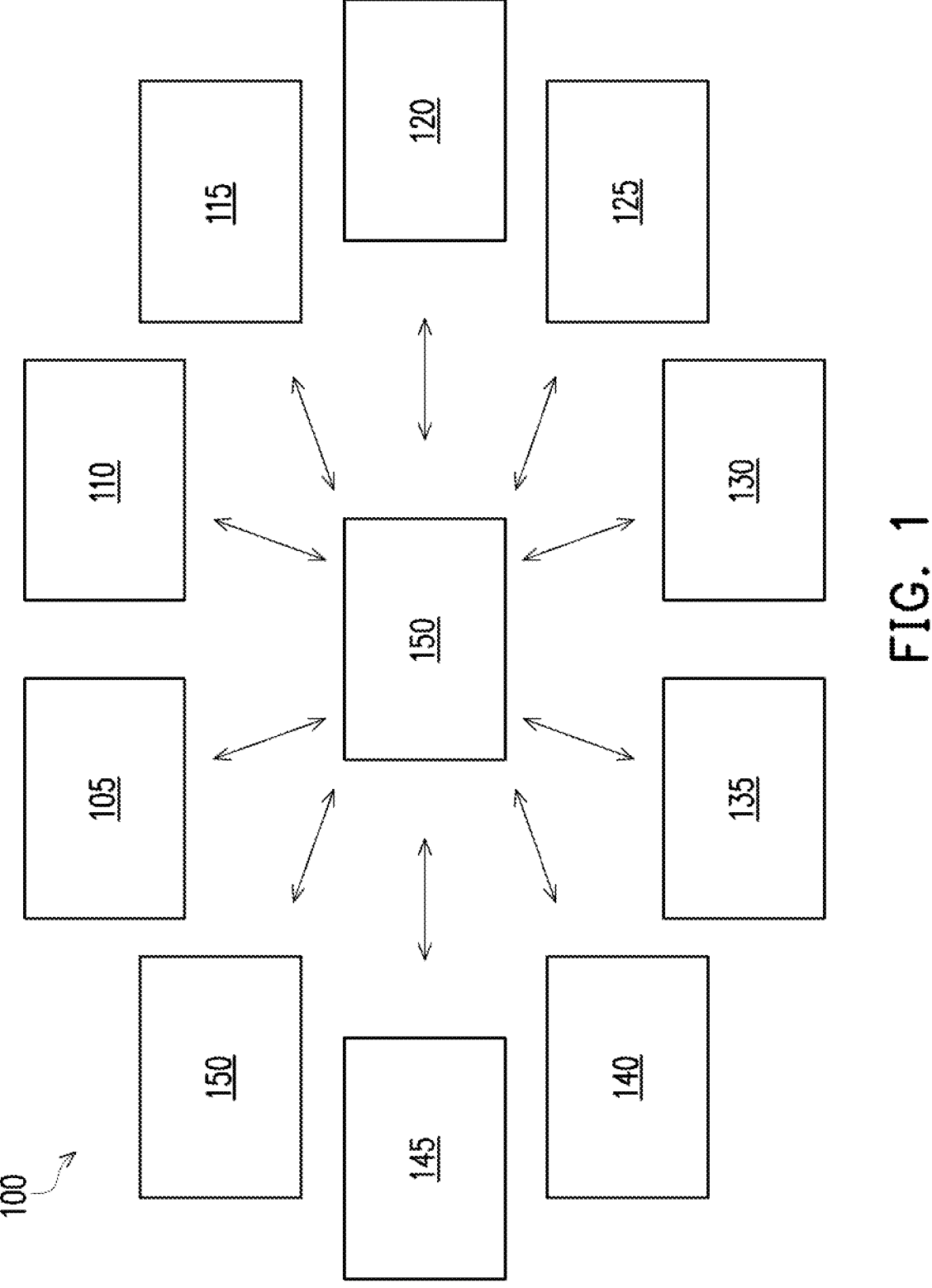
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a semiconductor die package such as an HPC semiconductor die package that is mounted in a fixture may include a connector (e.g., a fiber-optic connector or a cable connector, among other examples). The connector may communicatively connect the semiconductor die package with another device (e.g., a video source or a client computing system, among other examples). To access the connector, the fixture may include an opening in a lid component or in a sidewall of the fixture. In some implementations, the presence of the opening may reduce a structural rigidity of the fixture such that the lid component of the fixture may warp and separate from the thermal interface material, causing an increase in an effective thermal resistance of the fixture. Such an increase in the effective thermal resistance of the fixture may reduce a performance of one or more IC dies within the semiconductor die package. Such reductions in performance may include a reduced computing speed of a system-on-chip (SoC) IC die or a reduced refresh rate of a dynamic random access memory (DRAM) IC die, among other examples.

Some implementations described herein provide techniques and apparatuses for a fixture including a semiconductor die package and methods of formation. The semiconductor die package is mounted to an interposer. In addition to the semiconductor die package, the fixture includes a lid component having a top structure and footing structures that connect the lid component to the interposer. The fixture includes a thermal interface material between a top surface of the semiconductor die package and the top structure of the lid component. The footing structures, connected to the interposer using deposits of an epoxy material, increase a structural rigidity of the fixture relative to another fixture not including the footing structures.

The increased structural rigidity of the fixture, in combination with retention forces provided by the deposits of the epoxy material, may reduce a warpage and maintain a position of one or more components of the fixture, including a position of a top structure of the lid component. In this way, compression of the thermal interface material between the top surface of the semiconductor die package and the top structure of the lid component may be maintained to satisfy a thermal performance threshold of the fixture. Satisfying the thermal performance threshold may, in turn, result in the one or more IC dies within the semiconductor die package satisfying a circuitry performance threshold to be compatible with a computing application. Additionally, or alternatively, satisfying the thermal performance threshold may prolong a useful life of the semiconductor die package including the one or more IC dies.

FIG. 1 is a diagram of an example environment 100 in which systems and/or methods described herein may be implemented. As shown in FIG. 1, environment 100 may include a plurality of semiconductor processing tool sets 105-150 and a transport tool set 155. The plurality of semiconductor processing tool sets 105-150 may include a redistribution layer (RDL) tool set 105, a planarization tool set 110, an connection tool set 115, an automated test equipment (ATE) tool set 120, a singulation tool set 125, a die-attach tool set 130, an encapsulation tool set 135, a printed circuit board (PCB) tool set 140, a surface mount (SMT) tool set 145, and a finished goods tool set 150. The semiconductor processing tool sets 105-150 of example environment 100 may be included in one or more facilities, such as a semiconductor clean or semi-clean room, a semiconductor foundry, a semiconductor processing facility, an outsourced assembly and test (OSAT) facility, and/or a manufacturing facility, among other examples.

In some implementations, the semiconductor processing tool sets 105-150, and operations performed by the semiconductor processing tool sets 105-150, are distributed across multiple facilities. Additionally, or alternatively, one or more of the semiconductor processing tool sets 105-150 may be subdivided across the multiple facilities. Sequences of operations performed by the semiconductor processing tool sets 105-150 may vary based on a type of the semiconductor die package or a state of completion of the semiconductor die package.

One or more of the semiconductor processing tool sets 105-150 may perform a combination of operations to assemble a semiconductor die package (e.g., attach one or more IC dies to a substrate, where the substrate provides an external connectivity to a computing device, among other examples). Additionally, or alternatively, one or more of the semiconductor processing tool sets 105-150 may perform a combination of operations to ensure a quality and/or a reliability of the semiconductor die package (e.g., test and sort the one or more IC dies, and/or the semiconductor die package, at various stages of manufacturing).

The semiconductor die package may correspond to a type of semiconductor die package. For example, the semiconductor die package may correspond to a flipchip (FC) type of semiconductor die package, a ball grid array (BGA) type of semiconductor die package, a multi-chip package (MCP) type of semiconductor die package, or a chip scale package (CSP) type of semiconductor die package. Additionally, or alternatively, the semiconductor die package may correspond to a plastic leadless chip carrier (PLCC) type of semiconductor die package, a system-in-package (SIP) type of semiconductor die package, a ceramic leadless chip carrier (CLCC) type of semiconductor die package, or a thin small outline package (TSOP) type of semiconductor die package, among other examples.

The RDL tool set 105 includes one or more tools capable of forming one or more layers and patterns of materials (e.g., dielectric layers, conductive redistribution layers, and/or vertical connection access structures (vias), among other examples) on a semiconductor substrate (e.g., a semiconductor wafer, among other examples). The RDL tool set 105 may include a combination of one or more photolithography tools (e.g., a photolithography exposure tool, a photoresist dispense tool, a photoresist develop tool, among other examples), a combination of one or more etch tools (e.g., a plasma-based etched tool, a dry-etch tool, or a wet-etch tool, among other examples), and one or more deposition tools (e.g., a chemical vapor deposition (CVD) tool, a physical vapor deposition (PVD) tool, an atomic layer deposition (ALD) tool, or a plating tool, among other examples). In some implementations, the example environment 100 includes a plurality of types of such tools as part of RDL tool set 105.

The planarization tool set 110 includes one or more tools that are capable of polishing or planarizing various layers of the semiconductor substrate (e.g., the semiconductor wafer). The planarization tool set 110 may also include tools capable of thinning the semiconductor substrate. The planarization tool set 110 may include a chemical mechanical planarization (CMP) tool or a lapping tool, among other examples. In some implementations, the example environment 100 includes a plurality of types of such tools as part of the planarization tool set 110.

The connection tool set 115 includes one or more tools that are capable of forming connection structures (e.g., electrically-conductive structures) as part of the semiconductor die package. The connection structures formed by the connection tool set 115 may include a wire, a stud, a pillar, a bump, or a solderball, among other examples. The connection structures formed by the connection tool set 115 may include materials such as a gold (Au) material, a copper (Cu) material, a silver (Ag) material, a nickel (Ni) material, a tin (Sn) material, or a palladium (Pd) material, among other examples. The connection tool set 115 may include a bumping tool, a wirebond tool, or a plating tool, among other examples. In some implementations, the example environment 100 includes a plurality of types of such tools as part of the connection tool set 115.

The ATE tool set 120 includes one or more tools that are capable of testing a quality and a reliability of the one or more IC dies and/or the semiconductor die package (e.g., the one or more IC dies after encapsulation). The ATE tool set 120 may perform wafer testing operations, known good die (KGD) testing operations, semiconductor die package testing operations, or system-level (e.g., a circuit board populated with one or more semiconductor die packages and/or one or more IC dies) testing operations, among other examples. The ATE tool set 120 may include a parametric tester tool, a speed tester tool, a photonics tester tool, and/or a burn-in tool, among other examples. Additionally, or alternatively, the ATE tool set 120 may include a prober tool, probe card tooling, test interface tooling, test socket tooling, a test handler tool, burn-in board tooling, and/or a burn-in board loader/unloader tool, among other examples. In some implementations, the example environment 100 includes a plurality of types of such tools as part of the ATE tool set 120.

The singulation tool set 125 includes one or more tools that are capable of singulating (e.g., separating, removing) the one or more IC dies or the semiconductor die package from a carrier. For example, the singulation tool set 125 may include a dicing tool, a sawing tool, or a laser tool that cuts the one or more IC dies from the semiconductor substrate. Additionally, or alternatively, the singulation tool set 125 may include a trim-and-form tool that excises the semiconductor die package from a leadframe. Additionally, or alternatively, the singulation tool set 125 may include a router tool or a laser tool that removes the semiconductor die package from a strip or a panel of an organic substrate material, among other examples. In some implementations, the example environment 100 includes a plurality of types of such tools as part of the singulation tool set 125.

The die-attach tool set 130 includes one or more tools that are capable of attaching the one or more IC dies or the semiconductor die package to the interposer, the leadframe, a dicing tape, and/or the strip of the organic substrate material, among other examples. The die-attach tool set 130 may include a pick-and-place tool, a taping tool, a reflow tool (e.g., a furnace), a laser tool, a soldering tool, or an epoxy dispense tool, among other examples. In some implementations, the example environment 100 includes a plurality of types of such tools as part of the die-attach tool set 130.

The encapsulation tool set 135 includes one or more tools that are capable of encapsulating the one or more IC dies (e.g., the one or more IC dies attached to the interposer, the leadframe, or the strip of organic substrate material). For example, the encapsulation tool set 135 may include a molding tool that encapsulates the one or more IC dies in a plastic molding compound. Additionally, or alternatively, the encapsulation tool set 135 may include a dispense tool that dispenses an epoxy polymer underfill material between the one or more IC dies and an underlying surface (e.g., the interposer or the strip of organic substrate material, among other examples). In some implementations, the example environment 100 includes a plurality of types of such tools as part of the encapsulation tool set 135.

The PCB tool set 140 incudes one or more tools that are capable of forming a PCB having one or more layers of electrically-conductive traces. The PCB tool set 140 may form a type of PCB, such as a single layer PCB, a multi-layer PCB, or a high density connection (HDI) PCB, among other examples. In some implementations, the PCB tool set 140 forms the interposer and/or the substrate using one or more layers of a buildup film material and/or fiberglass reinforced epoxy material. The PCB tool set 140 may include a laminating tool, a plating tool, a photoengraving tool, a laser cutting tool, a pick-and-place tool, an etching tool, a dispense tool, a bonding tool, and/or a curing tool (e.g., a furnace) among other examples. In some implementations, the example environment 100 includes a plurality of types of such tools as part of the PCB tool set 140.

The SMT tool set 145 includes one or more tools that are capable of mounting the semiconductor die package to a circuit board (e.g., a central processing unit (CPU) PCB, a memory module PCB, an automotive circuit board, and/or a display system board, among other examples). The SMT tool set 145 may include a stencil tool, a solder paste printing tool, a pick-and-place tool, a reflow tool (e.g., a furnace), and/or an inspection tool, among other examples. In some implementations, the example environment 100 includes a plurality of types of such tools as part of the SMT tool set 145.

The finished goods tool set 150 includes one or more tools that are capable of preparing a final product including the semiconductor die package for shipment to a customer. The finished goods tool set 150 may include a tape-and-reel tool, a pick-and-place tool, a carrier tray stacking tool, a boxing tool, a drop-testing tool, a carousel tool, a controlled-environment storage tool, and/or a sealing tool, among other examples. In some implementations, the example environment 100 includes a plurality of types of such tools as part of the finished goods tool set 150.

The transport tool set 155 includes one or more tools that are capable of transporting work-in-process (WIP) between the semiconductor processing tools 105-150. The transport tool set 155 may be configured to accommodate one or more transport carriers such a wafer transport carrier (e.g., a wafer cassette or a front opening unified pod (FOUP), among other examples), a die carrier transport carrier (e.g., a film-frame carrier, among other examples), and/or a package transport carrier (e.g., a joint electron device engineering (JEDEC) tray or a carrier tape reel, among other examples). The transport tool set 155 may also be configured to transfer and/or combine WIP amongst transport carriers. The transport tool set 155 may include a pick-and-place tool, a conveyor tool, a robot arm tool, an overhead hoist transport (OHT) tool, an automated materially handling system (AMHS) tool, and/or another type of tool. In some implementations, the example environment 100 includes a plurality of types of such tools as part of the transport tool set 155.

One or more of the semiconductor processing tool sets 105-150 may perform one or more operations described herein. For example, one or more of the semiconductor processing tool sets 105-150 may perform one or more operations described in connection with FIGS. 2A-10, among other examples. The one or more operations include forming a footing structure of a lid component, where forming the footing structure includes forming a first portion including a first width along a first side of the lid component, and a second portion including a second width along a second side of the lid component that is opposite the first side, where the second width is greater relative to the first width or forming more than one third portions along the first side of the lid component and the second portion along the second side of the lid component. The one or more operations include mounting a semiconductor die package including an optical connector to an interposer. The one or more operation includes attaching the footing structure to the interposer, where attaching the footing structure to the interposer positions a top structure of the lid component over the semiconductor die package.

The number and arrangement of tool sets shown in FIG. 1 are provided as one or more examples. In practice, there may be additional tool sets, different tool sets, or differently arranged tool sets than those shown in FIG. 1. Furthermore, two or more tool sets shown in FIG. 1 may be implemented within a single tool set, or a tool set shown in FIG. 1 may be implemented as multiple, distributed tool sets. Additionally, or alternatively, one or more tool sets of environment 100 may perform one or more functions described as being performed by another tool set of environment 100.

Figure 2A:
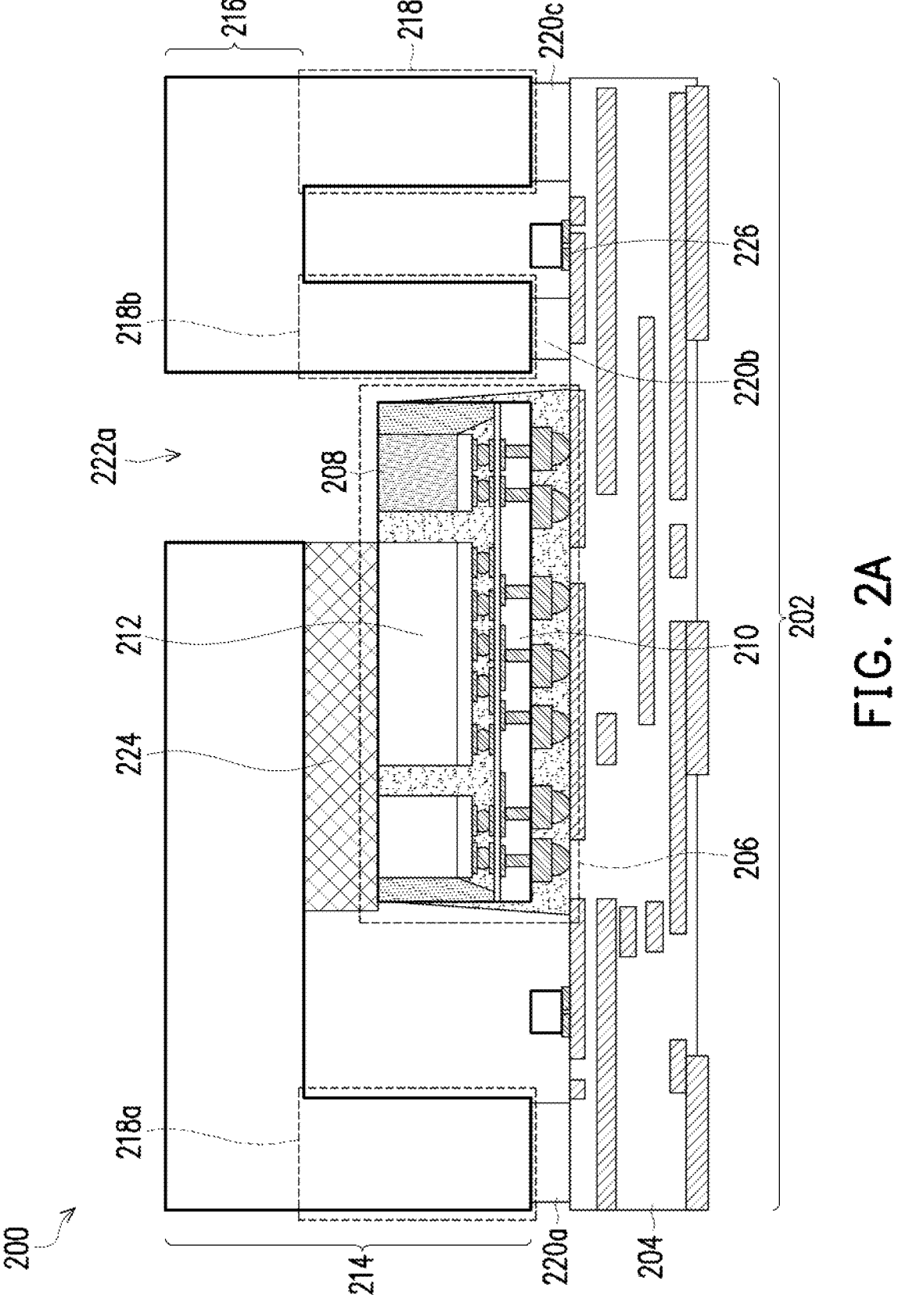
FIGS. 2A-2B, 3A-3B, 4A-4B, 5, 6A-6B, and 7A-7B are diagrams of example implementations of a fixture described herein.
Figure 2B:
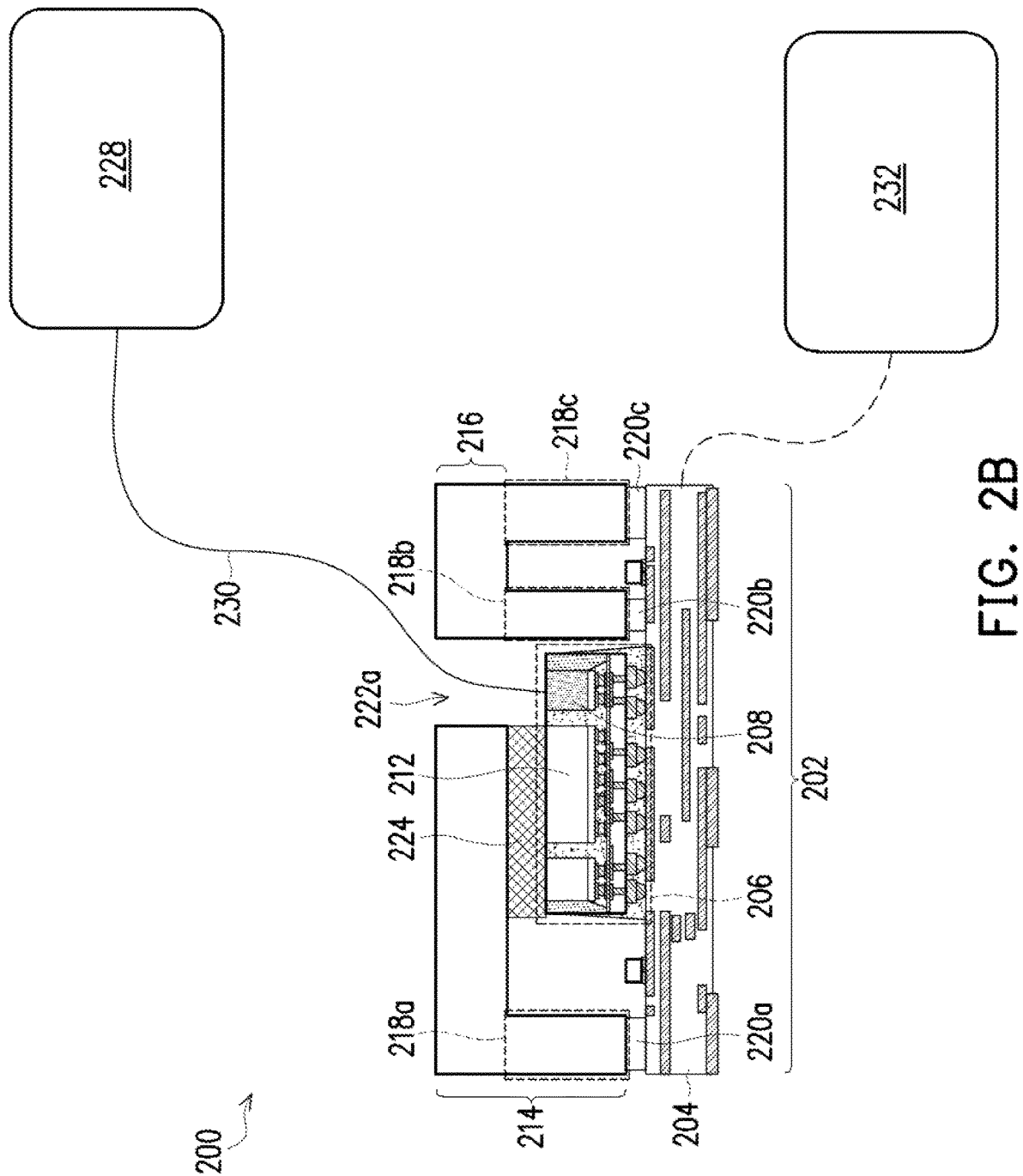

FIGS. 2A and 2B are diagrams of example implementation 200 of a fixture 202 described herein. FIGS. 2A and 2B include cross-section views of the fixture 202.

As shown in FIG. 2A, the fixture 202 includes an interposer 204. The interposer 204 may correspond to a chip-on-wafer-on substrate (CoWoS) interposer, a silicon or ceramic interposer including one or more redistribution layers (RDLs), or a printed circuit board (PCB) interposer, among other examples.

A semiconductor die package 206 may be mounted to traces and/or lands of the interposer 204. The semiconductor die package 206 includes a connector 208 mounted to a substrate 210 of the semiconductor die package. In some implementations, the connector 208 corresponds to an optical connector (e.g., a connector for a fiber-optic cable), a universal serial bus (USB) connector, an edge connector, a pin connector, or another type of connector, among other examples. The substrate 210 may correspond to a chip-on-wafer-on substrate (CoWoS) including through-silicon vias (TSVs), a silicon or ceramic substrate including one or more redistribution layers (RDLs), or a printed circuit board (PCB) substrate, among other examples. The semiconductor die package 206 further includes an integrated circuit (IC) die 212 adjacent to the connector 208. The IC die 212 may correspond to a system-on-chip (SoC) IC die, a memory IC die, a logic IC die, a transceiver IC die, or another type of IC die, among other examples.

The fixture 202 further includes a lid component 214. The lid component 214 includes a top structure 216 positioned over the semiconductor die package 206. The lid component 214 further includes a footing structure 218 (e.g., a combination of one or more footing structures 218a-218c) extending from the top structure 216 of the lid component 214 to the interposer 204.

The lid component 214, including the top structure 216 and/or the footing structure 218, may include a combination of one or more materials. The combination of one or more materials may include a copper (Cu) material, a nickel (Ni) material, a stainless-steel material, an aluminum material, and/or a carbon (C) material, among other examples.

In some implementations, a deposit 220 of an epoxy material (e.g., a combination of one or more deposits 220a-220c of the epoxy material) connect the footing structure 218 to the interposer 204. In some implementations, respective widths of the one or more deposits 220a-220c are proportional to respective widths of the one or more footing structures 218a-218c.

The lid component 214 further includes an access port 222 that provides access to the connector 208. For example, and in some implementations and as shown in FIG. 2A, the access port 222a (e.g., a top access port) passes through the top structure 216 to provide access to the connector 208.

In some implementations the semiconductor die package 206 (e.g., one or more IC dies including the IC die 212) generates an amount of heat. For example, the semiconductor die package 206 may generate up to approximately 3000 watts (W) of heat during a duty cycle of the IC die 212. However, other values and ranges for the amount of heat generated semiconductor die package 206 are within the scope of the present disclosure.

To dissipate heat from the semiconductor die package 206 so that a junction temperature of the IC die 212 (e.g., a temperature of a diode within the of the IC die 212) satisfies a threshold (e.g., remains at or below a target temperature in degrees Celsius), the fixture 202 may include a thermal interface material (TIM) 224 between a top surface of the semiconductor die package 206 and the top structure 216. The thermal interface material 224 may include combination of one or more thermally-conductive materials or structures. For example, the thermal interface material 224 may include a silicon-based gel material or an acrylic-based gel material. Additionally, or alternatively, the thermal interface material 224 may include a graphite material. Additionally, or alternatively, the thermal interface material 224 may include a combination of one or more carbon nanotubes. Additionally, or alternatively, the thermal interface material 224 may include an alloy material or a pure metal material including a tin (Sn) material, a silver (Ag) material, a gold (Au) material, a zinc (Zn) material, a bismuth (Bi) material, and/or an indium (In) material, among other examples.

In some implementations, and so that a performance of a thermal network including the thermal interface material 224 satisfies a threshold (e.g., a thermal-conductivity threshold in watts per meter Kelvin (W/m·K), among other examples), the thermal interface material 224 is compressed between the top surface of the semiconductor die package 206 and the top structure 216. Such a compression of the thermal interface material 224 enhance thermal contact (e.g., reduce thermal contact resistance) between the thermal interface material 224 and the top structure 216. Additionally, or alternatively, such a compression may enhance thermal contact (e.g., reduce thermal contact resistance) between the thermal interface material 224 and the top surface of the semiconductor die package 206.

In some implementations, the footing structures 218a-218c contribute to a moment of inertia of the lid component 214. In such cases, the moment of inertia may be such that a rigidity of the lid component 214 (e.g., a structural robustness) satisfies a bending moment threshold to maintain the compression of the thermal interface material 224. Additionally, or alternatively and relative to another lid component not including the footing structures 218a-218c, a likelihood of delamination of the top structure 216 from the thermal interface material 224 may be reduced.

Furthermore, the deposits 220a-220c of the epoxy material may retain the footing structure 218 (e.g., portions corresponding to the footing structures 218a-218c) to maintain the compression of the thermal interface material 224 between the top surface of the semiconductor die package 206 and the top structure 216.

In this way, a thermal performance of the fixture 202 (e.g., a thermal conductivity of the thermal network including the thermal interface material 224, among other examples) is maintained to satisfy a thermal performance threshold (e.g., a thermal performance threshold related to a rate of heat transferred or dissipated by the thermal network). By satisfying the thermal performance threshold, one or more IC dies (e.g., the IC die 212) may satisfy a junction temperature threshold (e.g., a temperature of a diode within the IC die 212). By satisfying the junction temperature threshold, the one or more IC dies may satisfy a circuitry performance threshold for compatibility with an application (e.g., a computing speed threshold or a refresh rate threshold, among other examples). Additionally, or alternatively, satisfying the thermal performance threshold (and the junction temperature threshold) may prolong a useful life of the semiconductor die package 206 including the one or more IC dies.

In the example implementation shown in FIG. 2B, the fixture 202 including the semiconductor die package 206 communicatively couples to a data source 228 using a cable 230. For example, the data source 228 may include a photonics source (e.g., a laser producing light waves, among other examples), the cable 230 may correspond to fiber-optic cable, and the connector 208 may correspond to an optical connector.

In some implementations, the fixture 202 communicatively couples to a computing resource 232 (e.g., the photonics tester tool included in the ATE tool set 120, among other examples). In some implementations, the interposer 204 communicatively couples to the computing resource 232 using one or more of an edge connector, a pogo-pin connector, a cabling component, and/or an interface board to which the fixture 202 is mounted, among other examples. The one or more IC dies of the semiconductor die package 206 (e.g., the IC die 212) may exchange information and/or data with the computing resource 232 to support the computing resource 232 executing an application (e.g., a testing application, among other examples).

As shown in FIG. 2B, the lid component 214 includes the footing structures 218a-218c. The cable 230 is routed through the access port 222a passing through the top structure 216 to connect with the connector 208. Furthermore, the cable 230 is routed between the footing structure 218b (e.g., an "inner" footing structure) and the thermal interface material 224.

As indicated above, FIGS. 2A and 2B are provided as an example. Other examples may differ from what is described with regard to FIGS. 2A and 2B.

Figure 3A:
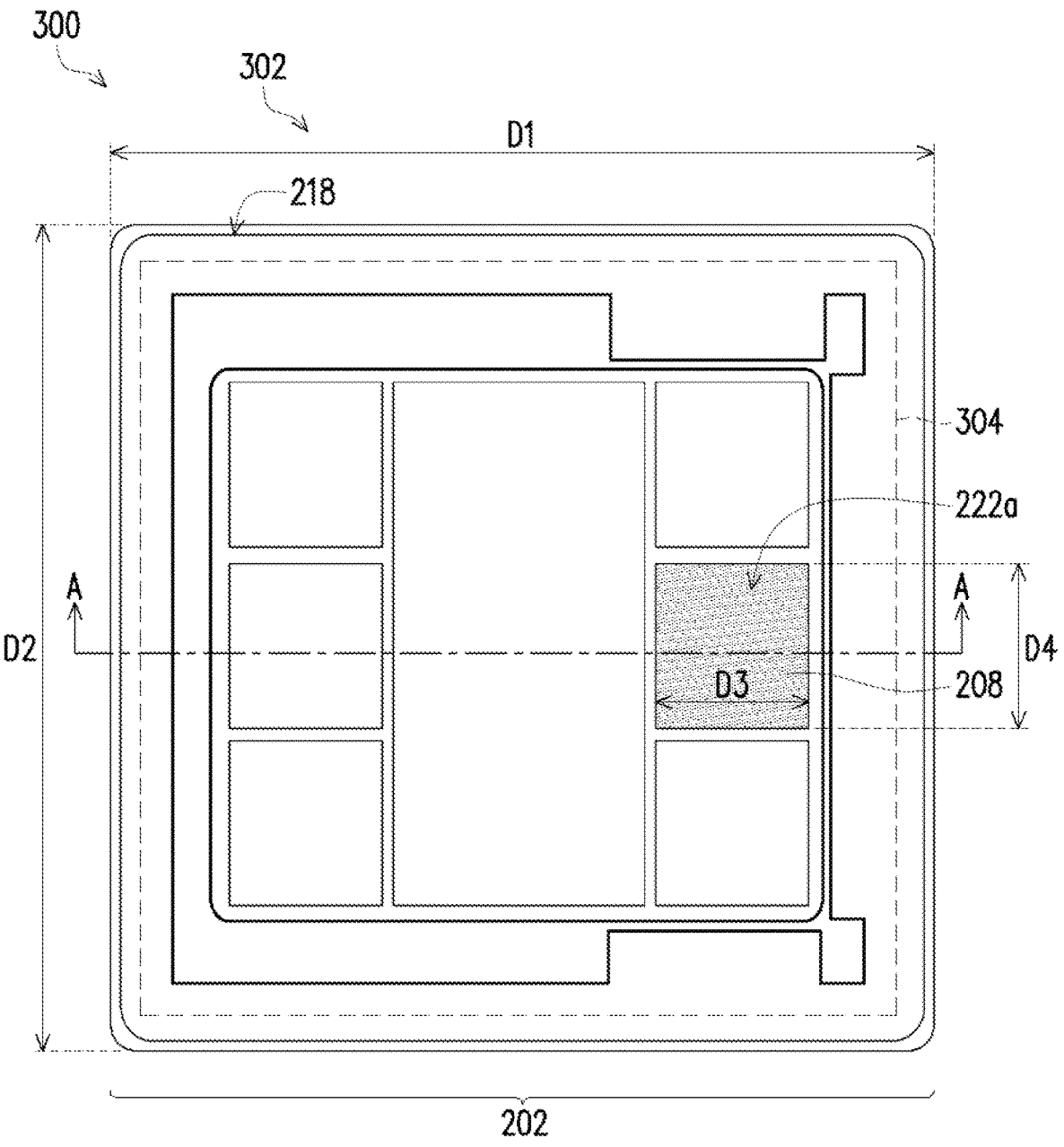
Figure 3B:
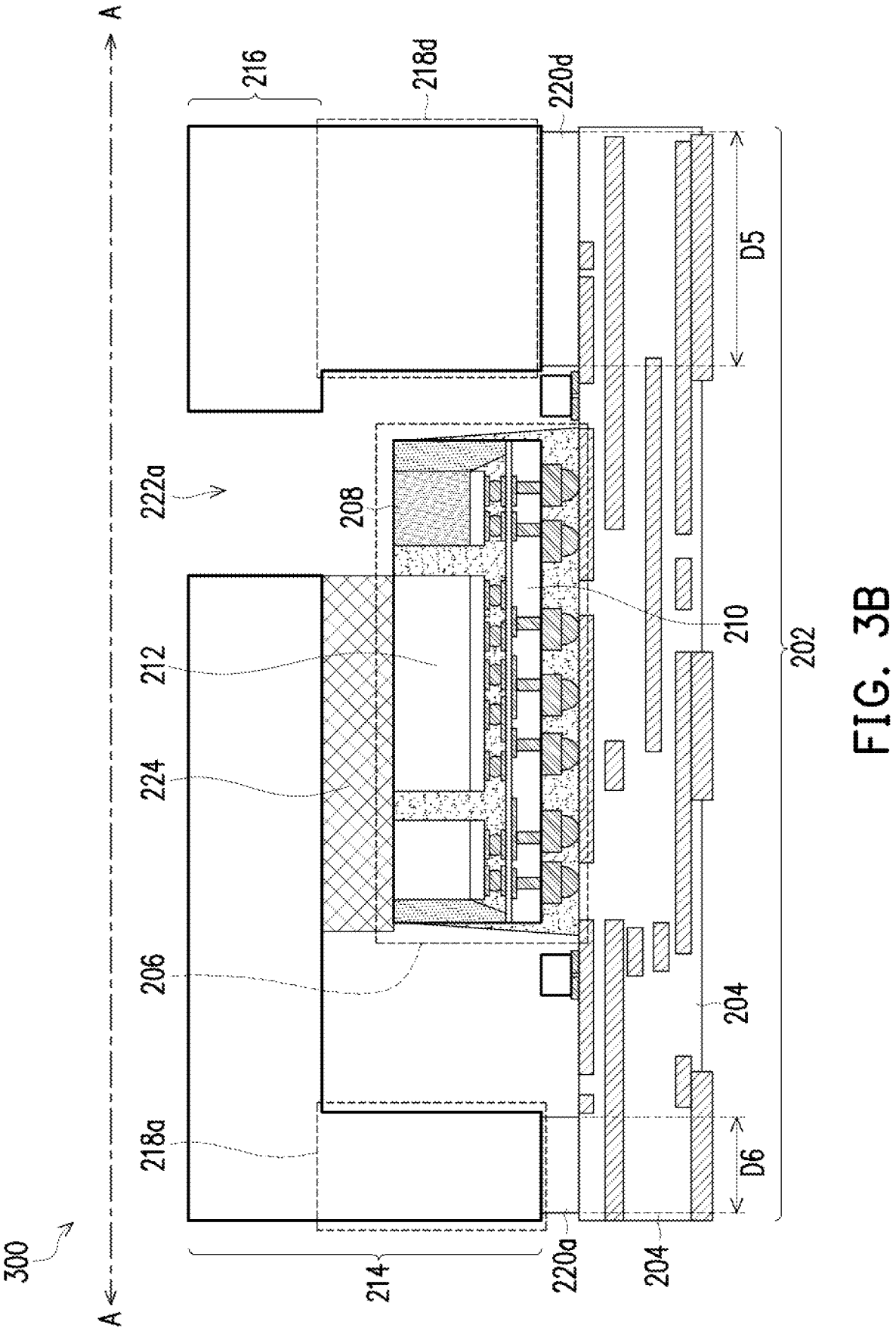

FIGS. 3A and 3B are diagrams of an example implementation 300 of the fixture 202 described herein. FIG. 3A includes a top-view 302 including a footprint (e.g., a plan-view or a layout-view) of the footing structure 218, where the footing structure 218 includes portions having different widths. In FIG. 3A, the connector 208 is visible in the top-view 302 through the access port 222a (e.g., the access port 222a that passes through the top structure 216).

The fixture 202 may have one or more dimensional properties. For example, the fixture 202 have a length D1 that is included in a range of approximately 40 millimeters to approximately 200 millimeters. Additionally, or alternatively the fixture 202 may have a width D2 that is included in a range of approximately 40 millimeters to approximately 200 millimeters. However, other values and ranges for the length D1 and the width D2 are within the scope of the present disclosure.

Additionally, or alternatively, the access port 222a may have one or more dimensional properties. For example, the access port 222a may have a length D3 that is included in a range of approximately 0.4 millimeters to approximately 5 millimeters. Additionally, or alternatively, the access port 222a may have a width D4 that is included in a range of approximately 0.4 millimeters to approximately 5 millimeters. However, other values and ranges for the length D3 and the width D4 are within the scope of the present disclosure.

As shown in FIG. 3A, the footing structure 218 includes portions along an approximate perimeter 304 of the fixture 202 (and/or the lid component 214). As described in greater detail in connection with FIG. 3B with reference to the section line A-A, the footing structure 218 may extend from the approximate perimeter 304 to an underlying interposer (e.g., the interposer 204). Additionally, or alternatively and as described in greater detail in connection with FIG. 3B, portions of the footing structure 218 may include section areas having different widths.

FIG. 3B includes a cross-section view A-A of the fixture 202 taken along the section line A-A of FIG. 3A. As shown in FIG. 3B, the connector 208 is accessible through the access port 222a. Furthermore, the connector 208, the IC die 212, the footing structure 218a, and the footing structure 218d are visible in the cross-section view A-A. The footing structure 218d is adjacent to a side of the connector 208 (e.g., a first side), and the IC die 212 is adjacent to an opposite side (e.g., a second side) of the connector 208. Additionally, or alternatively, the footing structures 218a and 218d extend from the top structure 216 to the interposer 204. Further, and as shown in FIG. 3B, the connector 208, the IC die 212, the first section area of the footing structure 218, and the second section area of the footing structure 218 are in line with one another.

As shown in FIG. 3B, the footing structure 218d (in other words a first portion or first section area of the footing structure 218) includes a width D5. In some implementations, the width D5 is included in a range of approximately 2.0 millimeters to approximately 50.0 millimeters. If the width D5 is less than approximately 2.0 millimeters, a moment of inertia of the footing structure 218 (e.g., a rigidity) may be insufficient to prevent a bending flexure that causes delamination of the top structure 216 from the thermal interface material 224. If the width D5 is greater than approximately 50.0 millimeters, a size of the lid component 214 may increase to increase a cost of the fixture 202 and consume additional space in a system containing the fixture 202. However, other values and ranges for the width D5 are within the scope of the present disclosure.

Also, as shown in FIG. 3B, the footing structure 218a (in other words a second portion or second section area of the footing structure 218) includes a width D6. In some implementations, the width D6 is included in a range of approximately 0.2 millimeters to approximately 15.0 millimeters. If the width D6 is less, than approximately 0.2 millimeters, then an adhesive force provided by the deposit 220a of the epoxy material may be insufficient to prevent a separation of the lid component 214 from the interposer 204. If the width D6 is greater than approximately 15.0 millimeters, a size of the lid component 214 may increase to increase a cost of the fixture 202 and consume additional space in a system containing the fixture 202. However, other values and ranges for the width D6 are within the scope of the present disclosure.

As shown further in FIG. 3B, a deposit 220d (e.g., a first deposit) of the epoxy material may be proportional to the width D5, and the deposit 220a (e.g., a second deposit) of the epoxy material may be proportional to the width D6.

In some implementations, and as shown in FIG. 3B, the width D5 is greater relative to D6 (e.g., the widths of the footing structures 218d and 218a may be "uneven"). If the width D5 is equal to D6, or lesser relative to D6, a structural rigidity of the lid component 214 may be insufficient to reduce a likelihood of delamination of the top structure 216 from the thermal interface material 224. Additionally, or alternatively, a retention force provided by the deposits 220d and 220a of the epoxy material may be insufficient to reduce a likelihood of the lid component 214 (e.g., the footing structures 218d and 218a) from separating from the interposer 204.

Delamination of the top structure 216 from the thermal interface material 224, and/or separation of the lid component 214 from the interposer 204, may decrease an effectiveness of the thermal network including the thermal interface material 224 and compromise a performance of the IC die 212 during operation (e.g., reduce a computing speed and/or shorten a useful life, among other examples). However, other relationships of the width D6 relative to the width D5 are within the scope of the present disclosure.

As shown in FIGS. 3A and 3B, the implementation 300 of fixture 202 includes the interposer 204. The fixture 202 includes the semiconductor die package 206 that is mounted to the interposer 204 and that includes a connector 208 mounted to the substrate 210 and the IC die 212 mounted to the substrate 210. The fixture 202 includes the lid component 214 that is mounted to the interposer 204 and that includes the top structure 216 positioned above the semiconductor die package 206, an access port 222a configured to provide access to the connector, and the footing structure 218, where the footing structure extends from an approximate perimeter 304 of the lid component 214 to the interposer 204, where a first section area of the footing structure 218 (e.g., a section area corresponding to the footing structure 218d) is adjacent to a first side of the connector 208, where the first section area includes a first width (e.g., the width D5), where a second section area of the footing structure 218 (e.g., a section area corresponding to the footing structure 218a) is adjacent to a second side of the connector 208 that is opposite the first side, where the second section area includes a second width (e.g., the width D6) that is lesser relative to the first width, and where the connector 208, the IC die 212, the first section area of the footing structure 218, and the second section area of the footing structure 218 are in line with one another.

As indicated above, FIGS. 3A and 3B are provided as an example. Other examples may differ from what is described with regard to FIGS. 3A and 3B.

Figure 4A:
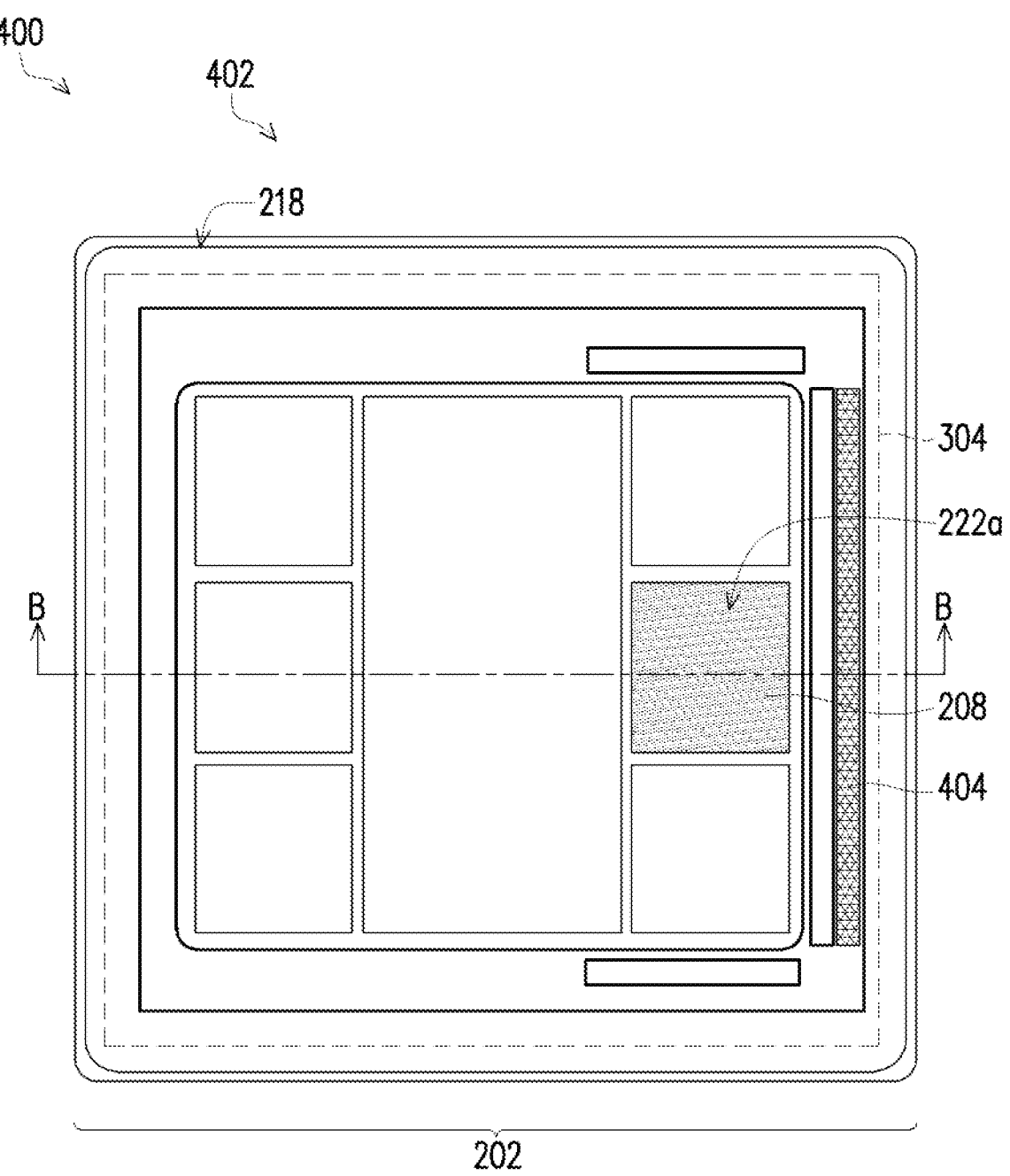
Figure 4B:
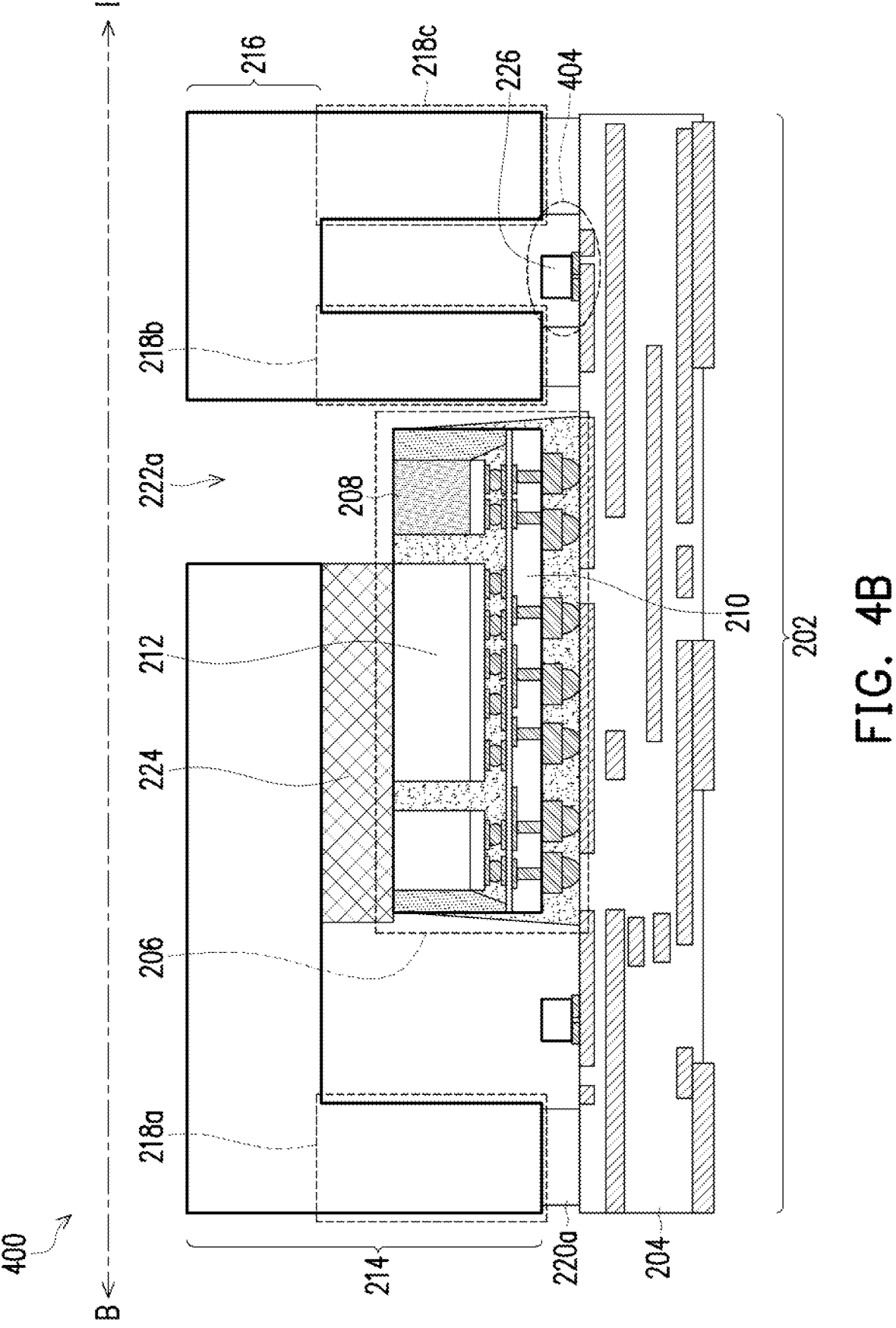

FIGS. 4A and 4B are diagrams of an example implementation 400 of the fixture 202 described herein. FIG. 4A includes a top-view 402 including a footprint (e.g., a plan-view or a layout-view) of the footing structure 218. A surface mount area 404 (e.g., a surface mount area for mounting one or more integrated circuit devices) may be located between the two or more portions of the footing structure 218. In FIG. 4A, the connector 208 is visible in the top-view 402 through the access port 222a (e.g., the access port 222a that passes through the top structure 216).

As shown in FIG. 4A, the footing structure 218 includes portions along the approximate perimeter 304 of the fixture 202 (and/or the lid component 214). As described in greater detail in connection with FIG. 4B with reference to the section line B-B, the footing structure 218 may include a portion extending from the approximate perimeter 304 to an underlying interposer (e.g., the interposer 204). Additionally, or alternatively and as described in greater detail in connection with FIG. 4B, the footing structure 218 may include one or more additional footing structures (e.g., inner portions) extending to the interposer 204.

FIG. 4B includes a cross-section view B-B of the fixture 202 taken along the section line B-B of FIG. 4A. As shown in FIG. 3B, the connector 208 is accessible through the access port 222a. Furthermore, the connector 208, the IC die 212, the footing structure 218a, the footing structure 218b, and the footing structure 218c are visible in the cross-section view B-B. The footing structure 218c (e.g., a first footing structure) is adjacent to a side of the connector 208 (e.g., a first side), and the IC die 212 is adjacent to an opposite side (e.g., a second side) of the connector 208. The footing structure 218b (e.g., a second footing structure or an "inner" footing structure) is located between the footing structure 218c and the connector 208. Additionally, or alternatively, the footing structures 218b and 218c extend from the top structure 216 to the interposer 204.

The IC device 226 may be mounted to the interposer 204 between the footing structures 218c and 218b (e.g., within the surface mount area 404). Examples of the IC device 226 include an integrated passive device such as a capacitor or a resistor, among other examples.

The fixture 202 includes the lid component 214 that is mounted to the interposer 204. The lid component 214 includes the top structure 216 positioned above the semiconductor die package 206. The lid component 214 includes an access port 222a configured to provide access to the connector 208. The lid component 214 includes a first footing structure (e.g., the footing structure 218c) extending from the top structure 216 to the interposer 204 and a second footing structure (e.g., the footing structure 218b) extending from the top structure 216 to the interposer 204, where the second footing structure is adjacent to a second side of the connector 208 that is opposite the first side, and where the second footing structure is between the connector 208 and the first footing structure.

As shown in FIGS. 4A and 4B, the implementation 400 of the fixture 202 includes the interposer 204. The fixture 202 includes the semiconductor die package 206 that is mounted to the interposer 204 and that includes the connector 208 mounted to the substrate 210 substrate 210 and the IC die 212 mounted to the substrate 210 adjacent to a first side of the connector 208. The fixture 202 includes the lid component 214 that is mounted to the interposer 204 and that includes the top structure 216 positioned above the semiconductor die package 206, an access port 222a configured to provide access to the connector 208, a first footing structure (e.g., the footing structure 218c) extending from the top structure to the interposer 204, and a second footing structure (e.g., the footing structure 218b) extending from the top structure 216 to the interposer 204, where the second footing structure is adjacent to a second side of the connector 208 that is opposite the first side, and where the second footing structure is between the connector 208 and the first footing structure.

As indicated above, FIGS. 4A and 4B are provided as an example. Other examples may differ from what is described with regard to FIGS. 4A and 4B.

Figure 5:
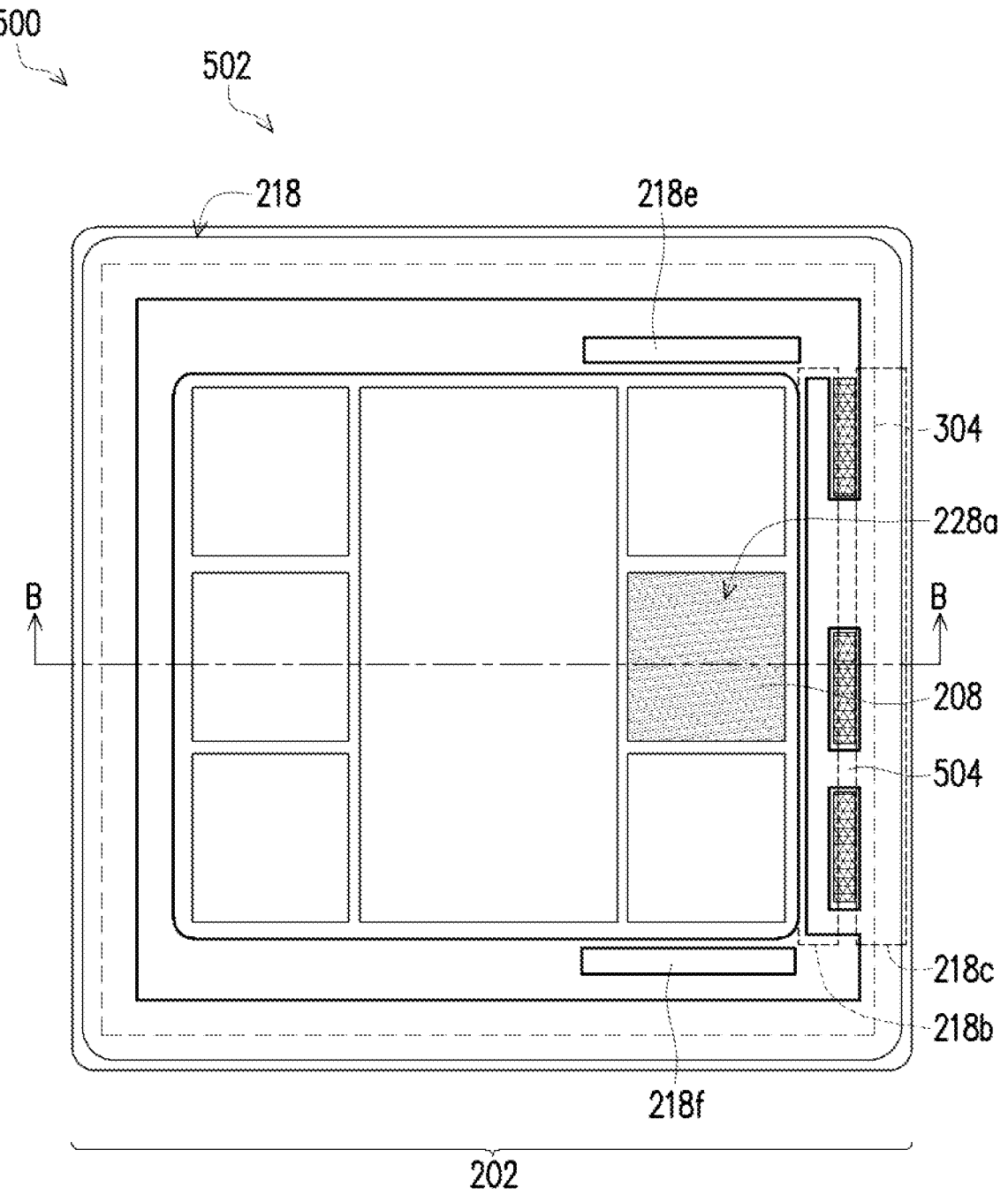

FIG. 5 is a diagram of an example implementation 500 of the fixture 202 described herein. FIG. 5 includes a top-view 502 including a footprint (e.g., a plan-view or a layout-view) of the footing structure 218, where the footing structure 218 includes multiple portions and an extension structure 504 that connects at least two portions (e.g., the footing structures 218b and 218c, among other examples). As shown in FIG. 5, the footing structure 218 may include additional portions (e.g., the footing structures 218e and 218f, among other examples). The additional portions may be approximately orthogonal to one or more other portions of the footing structure 218 (e.g., approximately orthogonal to the footing structures 218b and 218c).

As indicated above, FIG. 5 is provided as an example. Other examples may differ from what is described with regard to FIG. 5.

Figure 6A:
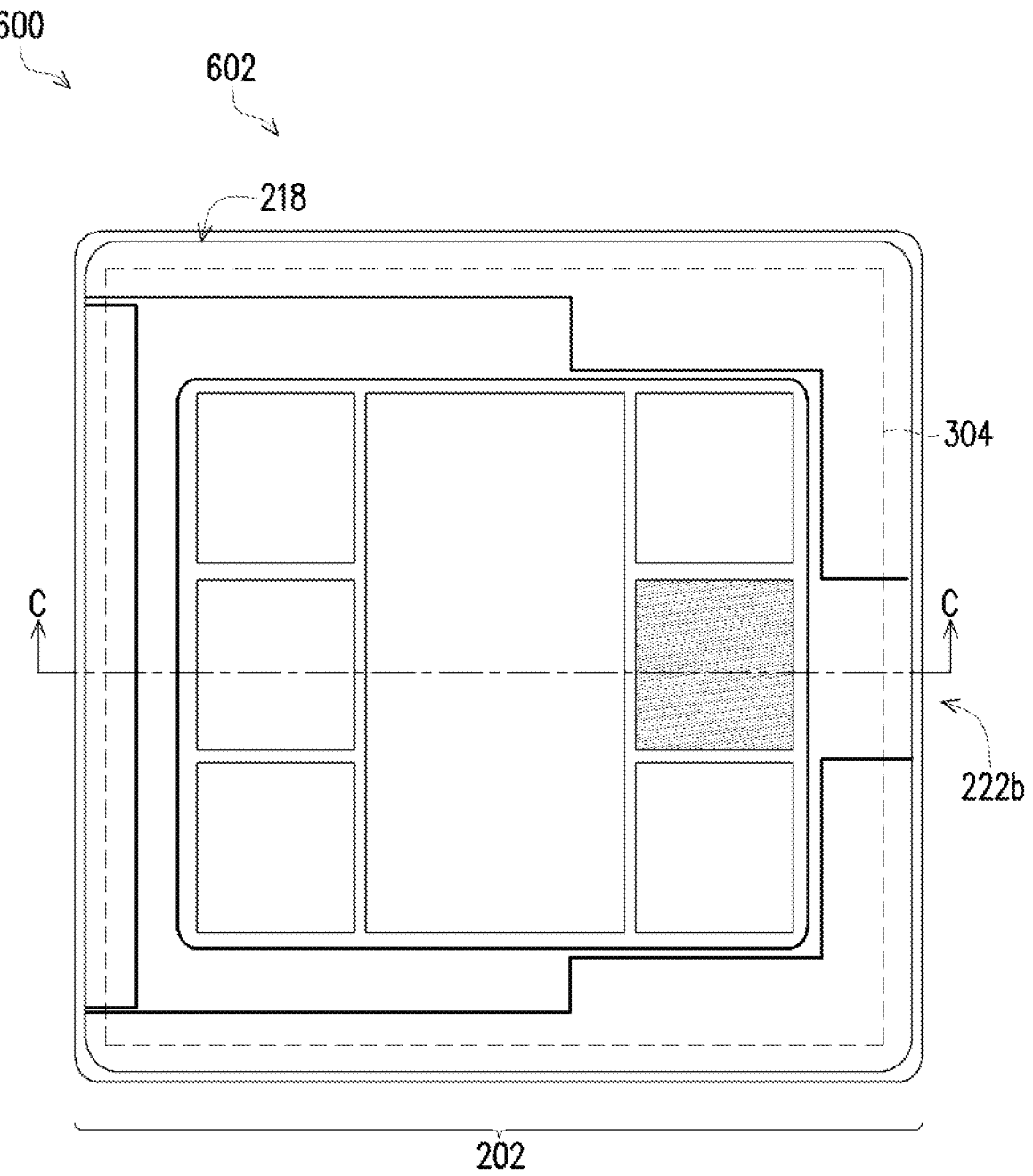
Figure 6B:
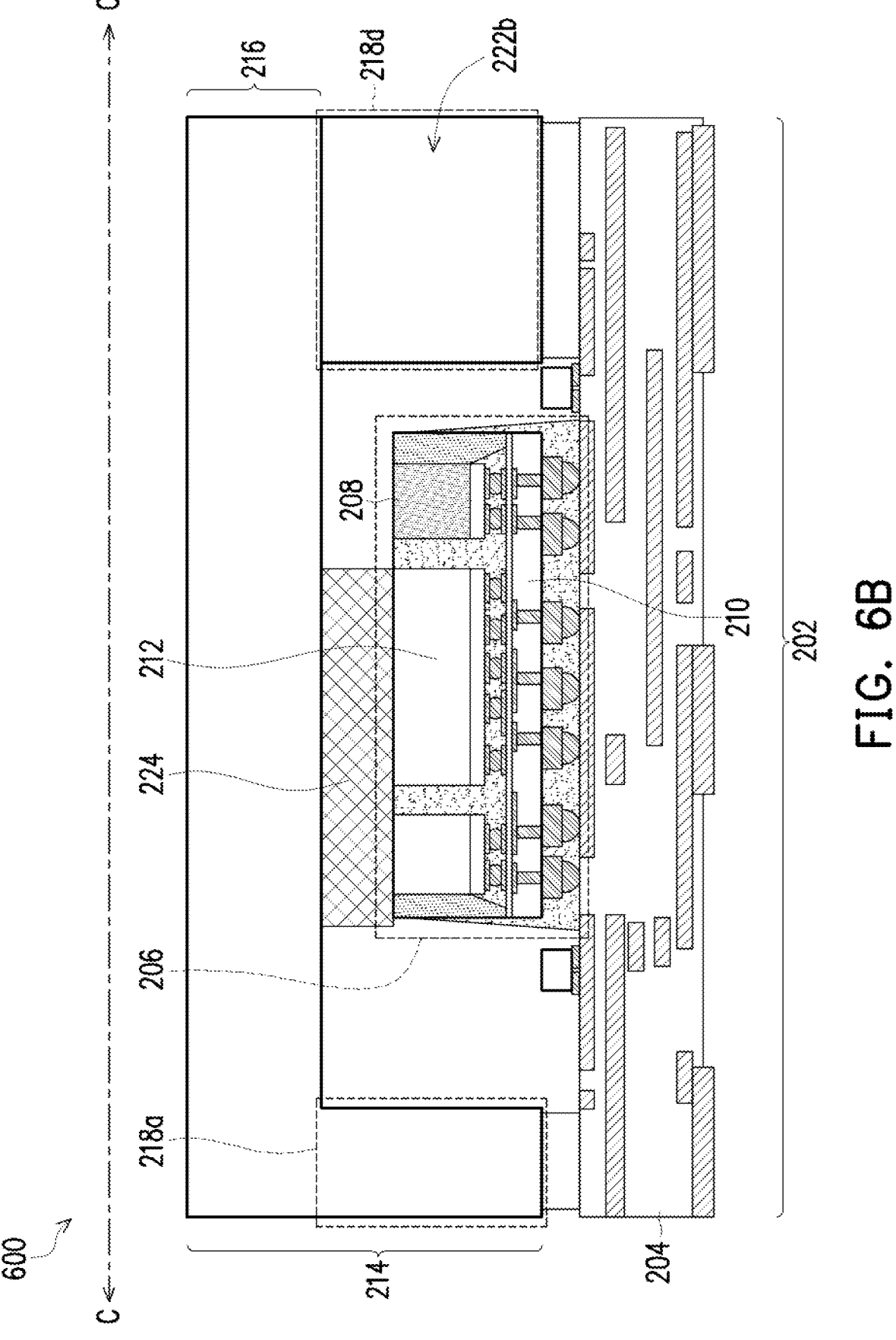

FIGS. 6A and 6B are diagrams of an example implementation 600 of the fixture 202 described herein. FIG. 6A includes a top-view 602 including a footprint (e.g., a plan-view or a layout-view) of the footing structure 218, where the footing structure 218 includes portions having different widths. In FIG. 6A, the connector 208 is hidden in the top-view 602 and may be accessed through the access port 222b (e.g., a side access port) that passes through the footing structure 218 (e.g., through a sidewall of the lid component 214).

As shown in FIG. 6A, the footing structure 218 includes portions along the approximate perimeter 304 of the fixture 202 (and/or the lid component 214). As described in greater detail in connection with FIG. 6B with reference to the section line C-C, the footing structure 218 may extend from the approximate perimeter 304 to an underlying interposer (e.g., the interposer 204). Additionally, or alternatively and as described in greater detail in connection with FIG. 6B, portions of the footing structure 218 may include section areas having different widths.

FIG. 6B includes a cross-section view C-C of the fixture 202 taken along the section line C-C of FIG. 6A. As shown in FIG. 6B, the connector 208 is accessible through the access port 222b that passes through the footing structure 218d (e.g., through a sidewall of the lid component 214). Furthermore, the connector 208, the IC die 212, the footing structure 218a, and the footing structure 218d are visible in the cross-section view C-C. The footing structure 218d is adjacent to a side of the connector 208 (e.g., a first side), and the IC die 212 is adjacent to an opposite side (e.g., a second side) of the connector 208. Additionally, or alternatively, the footing structures 218a and 218d extend from the top structure 216 of the lid component 214 to the interposer 204.

As indicated above, FIGS. 6A and 6B are provided as an example. Other examples may differ from what is described with regard to FIGS. 6A and 6B.

Figure 7A:
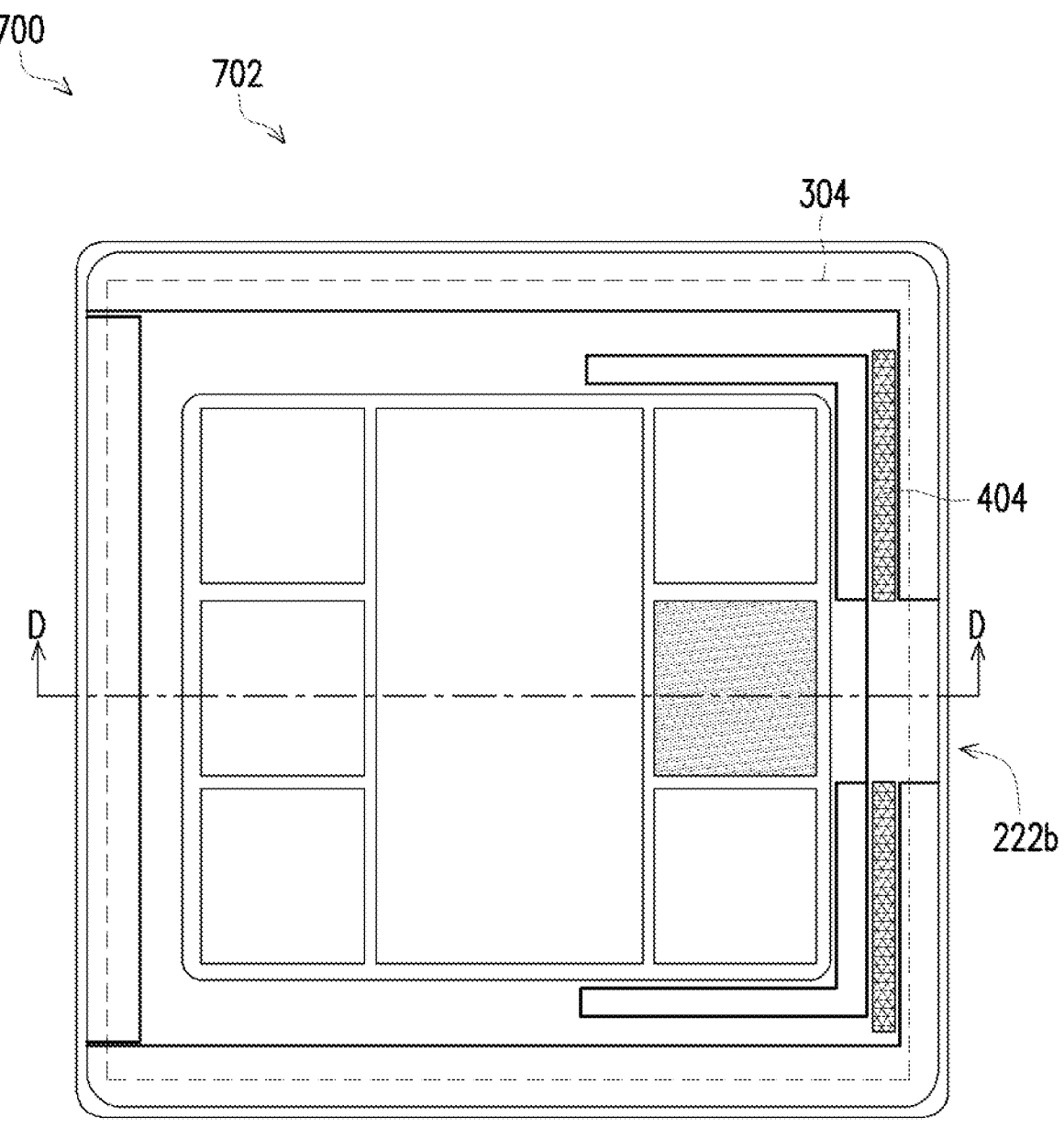
Figure 7B:
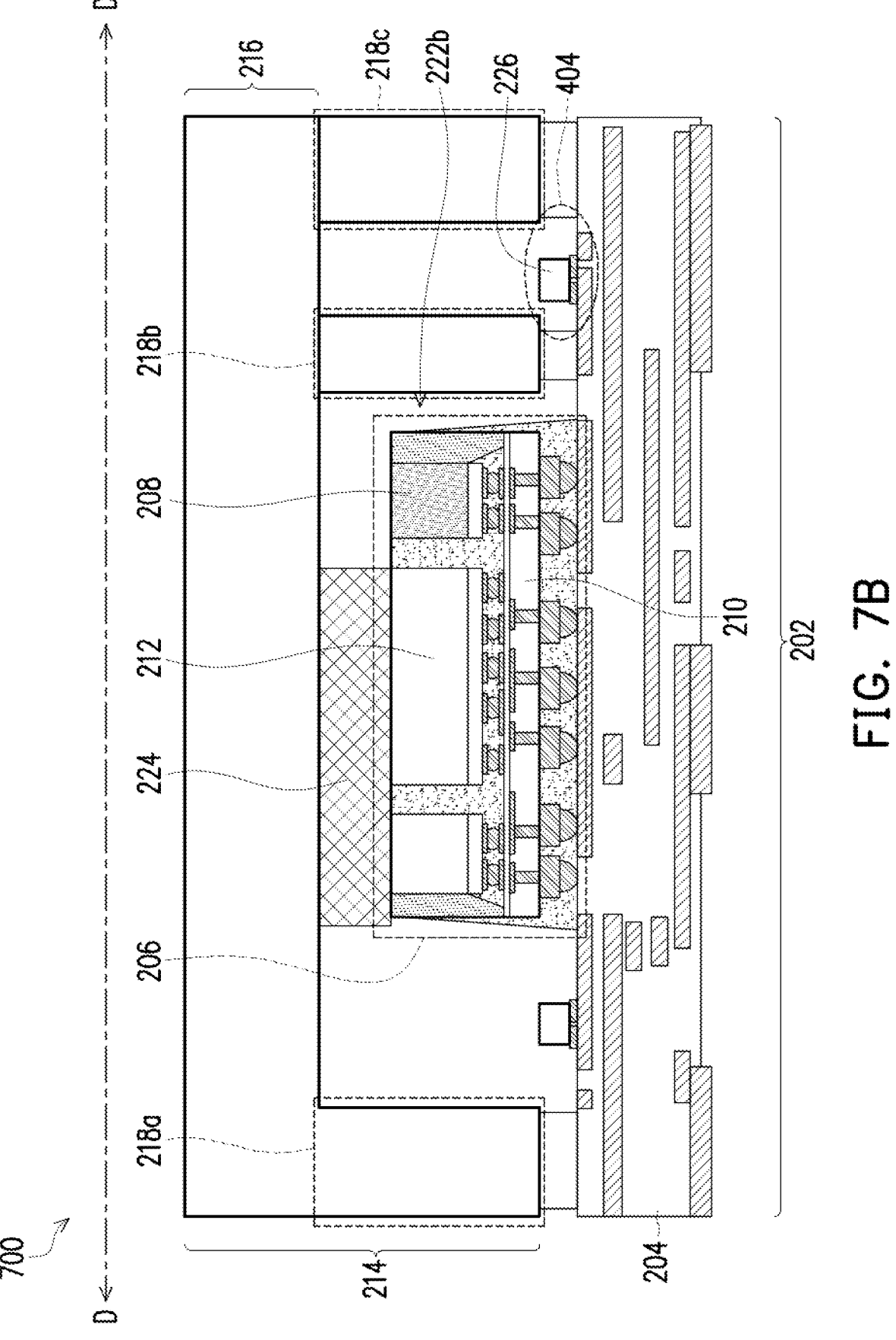

FIGS. 7A and 7B are diagrams of an example implementation 700 of the fixture 202 described herein. FIG. 7A includes a top-view 702 including a footprint (e.g., a plan-view or a layout-view) of the footing structure 218. A surface mount area 404 (e.g., an area for mounting one or more integrated circuit devices) may between two or more portions of the footing structure 218. In FIG. 7A, the connector 208 is hidden in the top-view 702 and may be accessed through the access port 222b that passes through the footing structure 218b and 218c (e.g., through sidewalls of the lid component 214).

As shown in FIG. 7A, the footing structure 218 includes portions along the approximate perimeter 304 of the fixture 202 (and/or the lid component 214). As described in greater detail in connection with FIG. 7B with reference to the section line D-D, the footing structure 218 may include a portion extending from the approximate perimeter 304 to an underlying interposer (e.g., the interposer 204). Additionally, or alternatively, the footing structure 218 may include one or more additional footing structures (e.g., inner portions) extending to the interposer.

FIG. 7B includes a cross-section view D-D of the fixture 202 taken along the section line D-D of FIG. 7A. As shown in FIG. 7B, the connector 208 is accessible through the access port 222b that passes through the footing structures 218b and 218c. Furthermore, the connector 208, the IC die 212, the footing structure 218a, the footing structure 218b, and the footing structure 218c are visible in the cross-section view D-D. The footing structure 218c (e.g., a first footing structure) is adjacent to a side of the connector 208 (e.g., a first side), and the IC die 212 is adjacent to an opposite side (e.g., a second side) of the connector 208. The footing structure 218b (e.g., a second footing structure or an "inner" footing structure) is between the footing structure 218c and the connector 208. Additionally, or alternatively, the footing structures 218b and 218c extend from the top structure 216 of the lid component 214 to the interposer 204.

The IC device 226 may be mounted to the interposer 204 between the footing structures 218c and 218b (e.g., within the surface mount area 404).

As indicated above, FIGS. 7A and 7B are provided as an example. Other examples may differ from what is described with regard to FIGS. 7A and 7B.

FIGS. 8A-8F are diagrams of an example manufacturing process flow 800 described herein. In some implementations, the manufacturing process flow 800 uses one or more tools of the semiconductor processing tools 105-150 to form portions of the fixture 202 including the lid component 214. Furthermore, FIGS. 8A-8F show a section view E-E of the manufacturing process flow 800, which may correspond to one or more of the section views A-A through D-D shown in connection with FIG. 3B, 4B, 6B, or 7B.

Figure 8A:
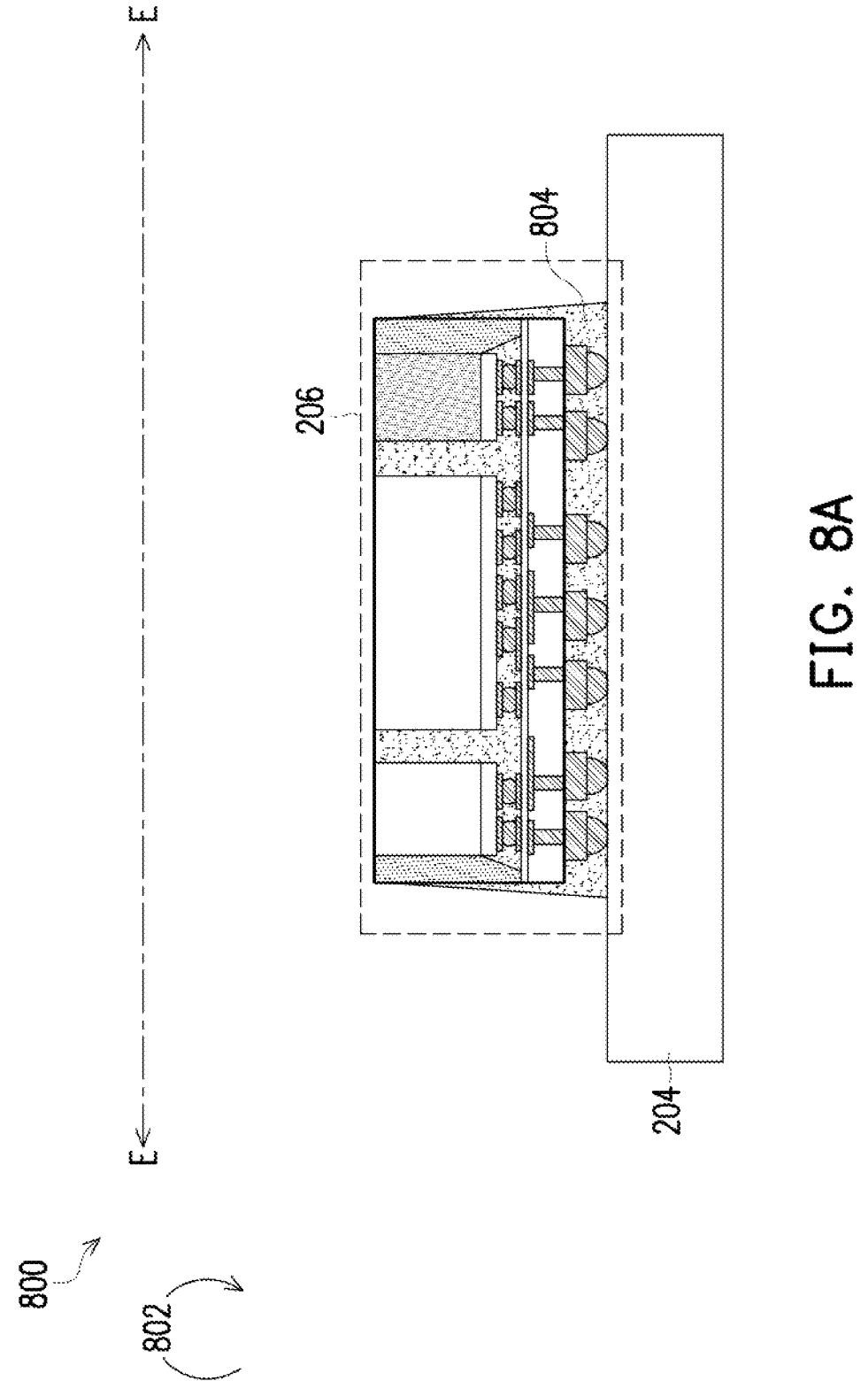
FIGS. 8A-8F are diagrams of an example manufacturing process flow described herein.

As shown in FIG. 8A, one or more tools of the of the semiconductor processing tool sets 105-150 may perform a series of operations 802 to attach the semiconductor die package 206 to the interposer 204. For example, the pick-and-place tool and the reflow tool of the die-attach tool set 130 may attach the semiconductor die package 206 to the interposer 204. Additionally, or alternatively as part of the series of operations 802, the dispense tool of the encapsulation tool set 135 may dispense an encapsulant material 804 (e.g., an epoxy-resin based material) around the semiconductor die package 206.

Figure 8B:
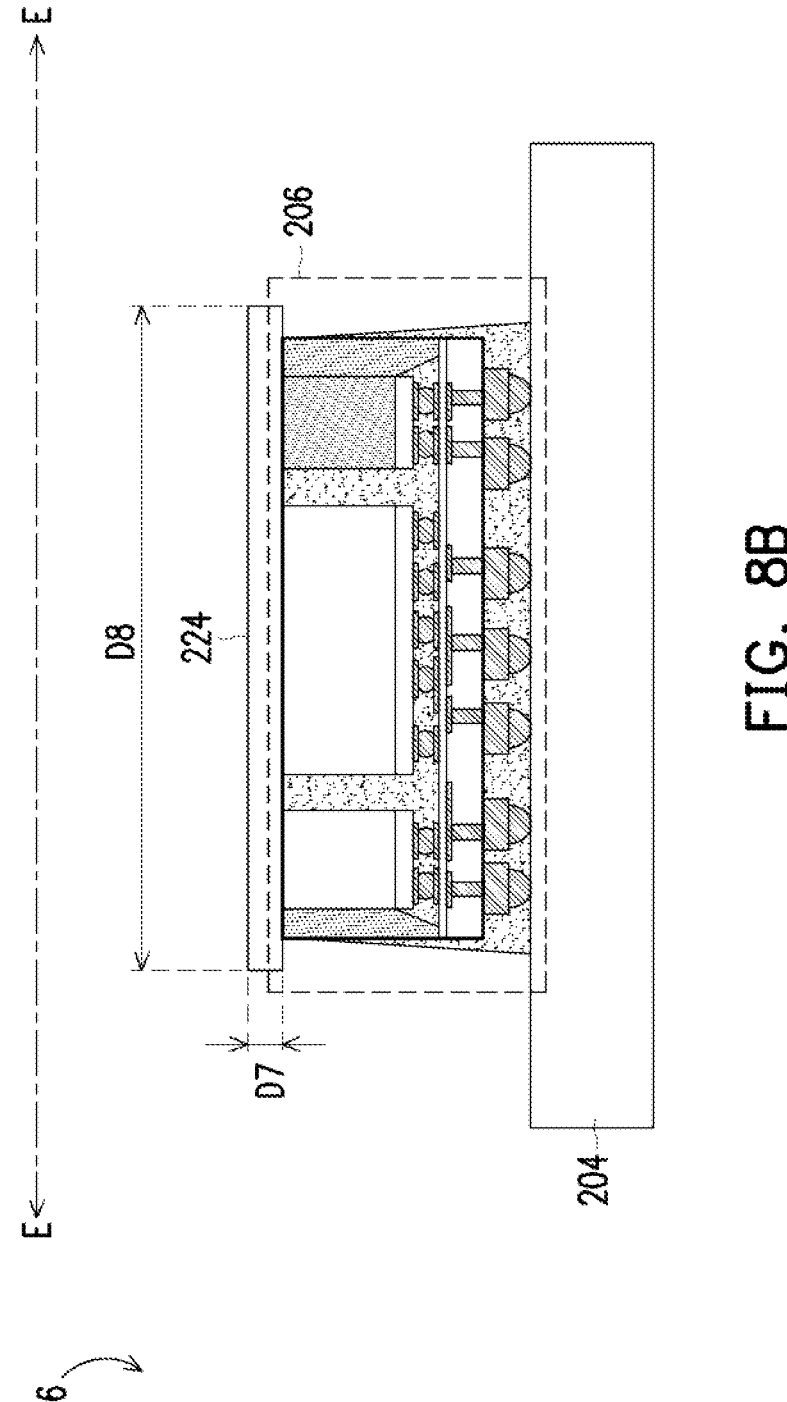

As shown in FIG. 8B, one or more tools of the of the semiconductor processing tool sets 105-150 may perform a series of operations 806 to form the thermal interface material 224 on the top surface of the semiconductor die package 206. For example, the dispense tool of the encapsulation tool set 135 may dispense the thermal interface material 224 on the top surface of the semiconductor die package 206. Additionally, or alternatively, the pick-and-place tool of the die-attach tool set 130 may attach the thermal interface material 224 to the top surface of the semiconductor die package 206.

The thermal interface material 224 may be deposited such that the thermal interface material 224 includes one or more dimensional properties. For example, the thermal interface material 224 may be deposited such that the thermal interface material 224 has a thickness D7 that is included in a range of approximately 20 microns to approximately 300 microns. Additionally, or alternatively, the thermal interface material 224 may be deposited such that the thermal interface material 224 has a length (or width) D8 that is included in a range of approximately 20 millimeters to approximately 70 millimeters. However, other values and ranges for the thickness D7 and the length (or width) D8 are within the scope of the present disclosure.

Figure 8C:
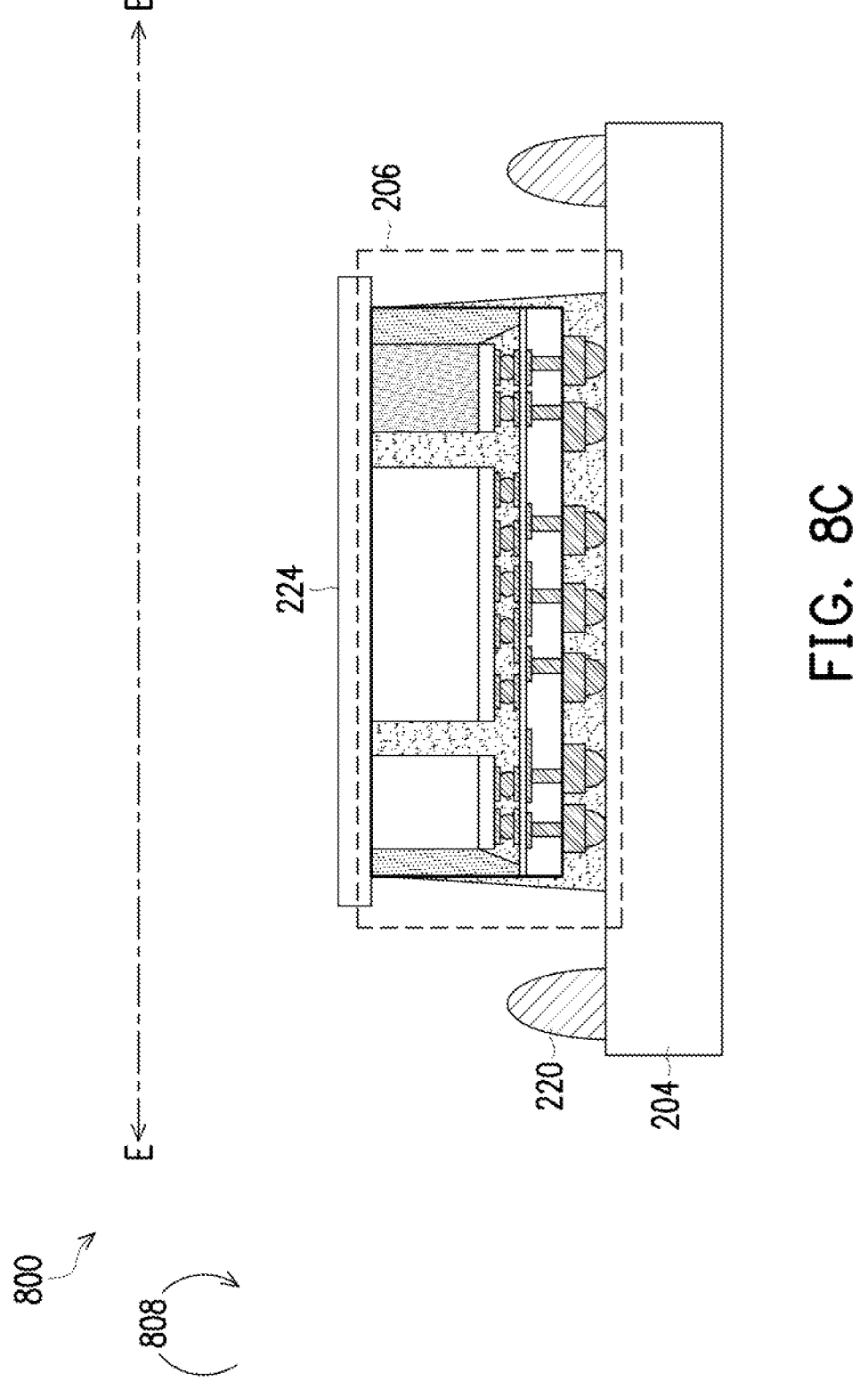

As shown in FIG. 8C, one or more tools of the of the semiconductor processing tool sets 105-150 may perform a series of operations 808 to form the deposits 220 of the epoxy material on the interpose. For example, the dispense tool of the encapsulation tool set 135 may dispense the deposits 220 of the epoxy material on the interposer 204.

Figure 8D:
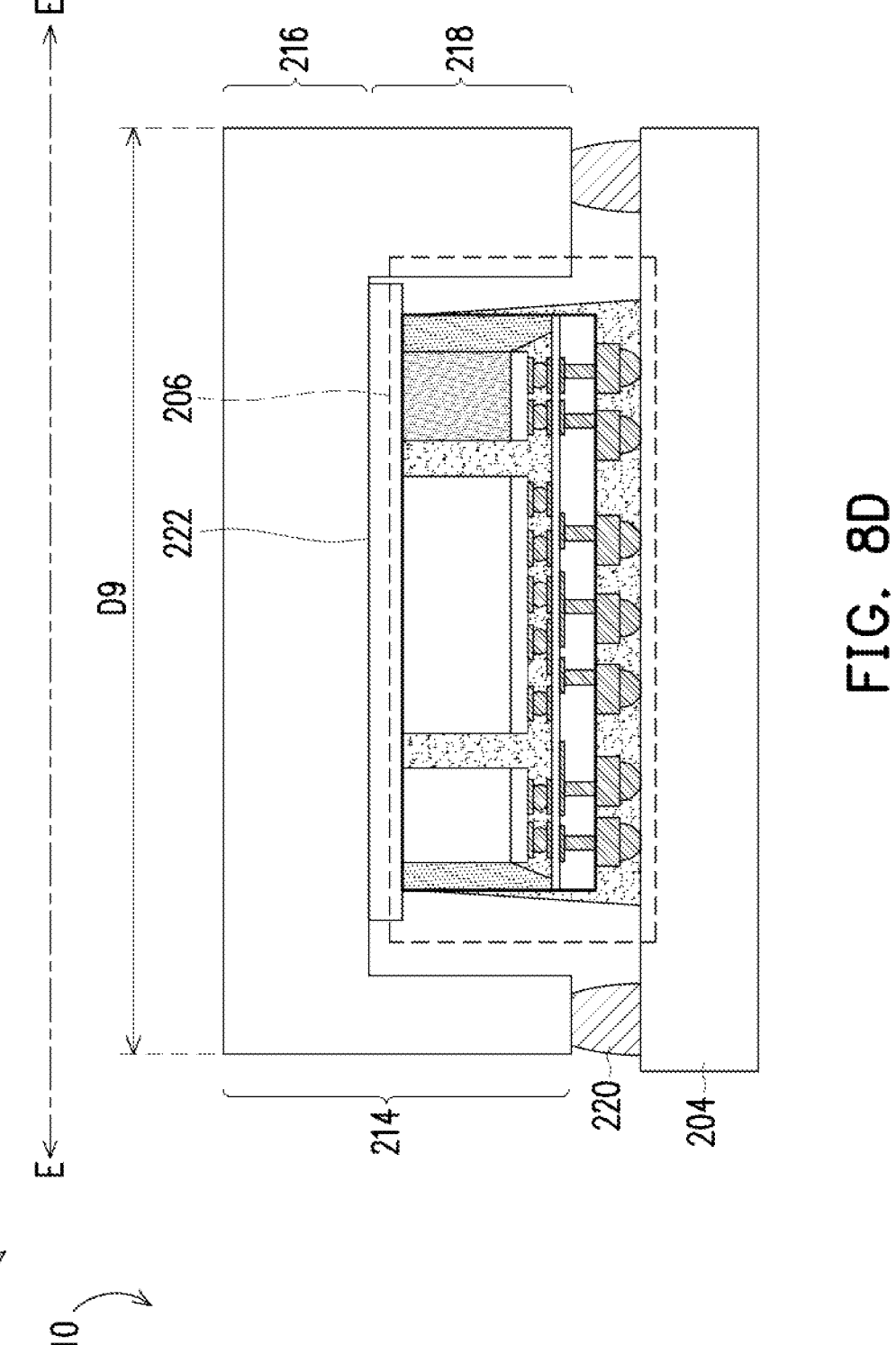

As shown in FIG. 8D, a series of operations 810 may include a stamping tool or an injection molding tool forming the lid component 214 including the top structure 216 and the footing structure 218. The lid component 214 may be formed to include one or more dimensional properties. For example, the lid component 214 may be formed to include a width (or length) D9 that is included in a range of approximately 35 millimeters to approximately 195 millimeters. However, other values and ranges for the width (or length) D8 are within the scope of the present disclosure.

Additionally, or alternatively, the series of operations 810 as shown in FIG. 8D may include one or more tools of the semiconductor processing tool sets 105-150 attaching the lid component 214 to the interposer 204. For example, the pick-and-place tool of the die-attach tool set 130 may attach the lid component 214 to the interposer 204 (e.g., attach the footing structure 218 to the deposits 220 of the epoxy material).

Figure 8E:
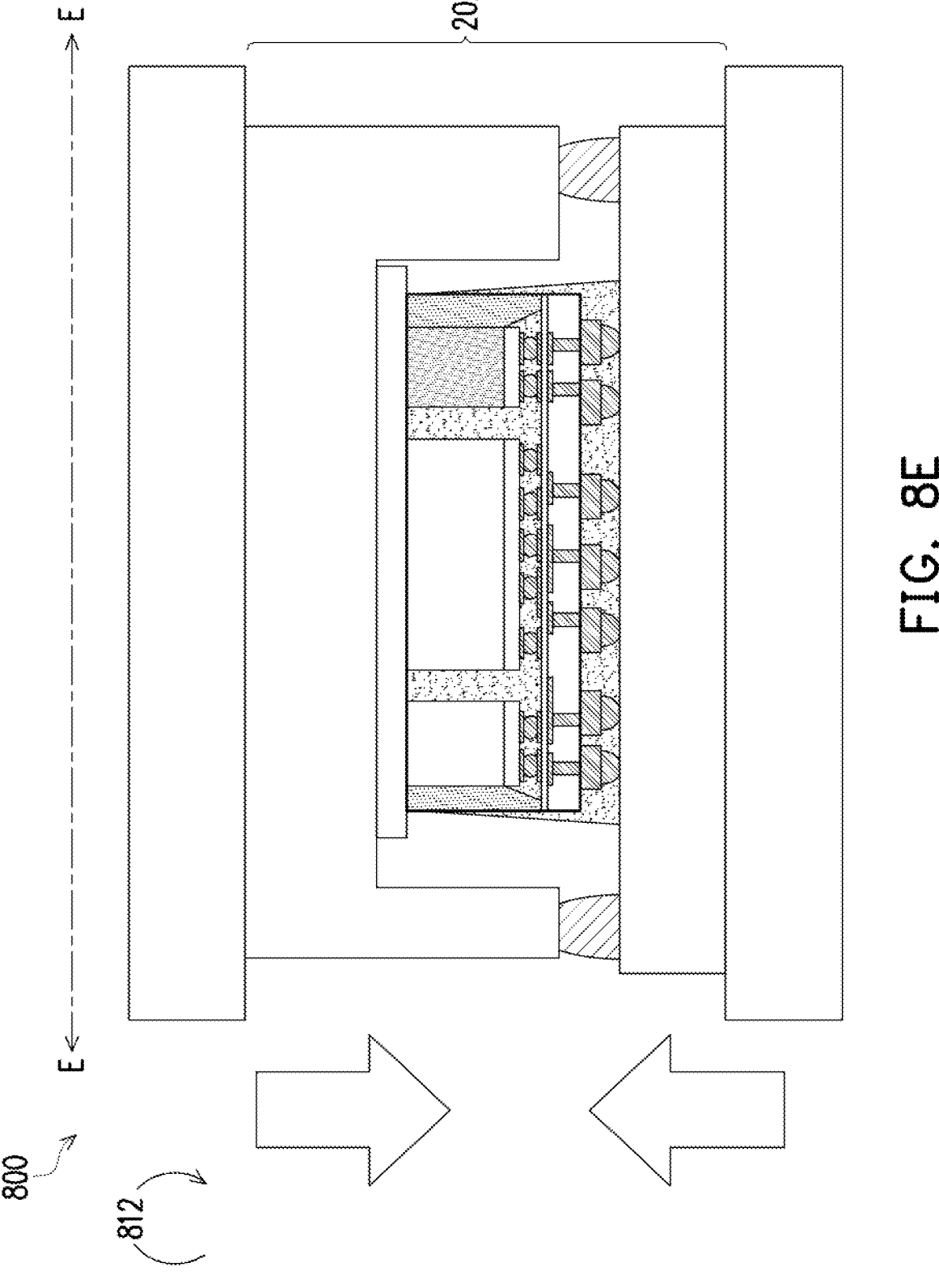

As shown in FIG. 8E, a clamping tool may compress the lid component 214 into deposits 220 of the epoxy material to form the fixture 202.

Figure 8F:
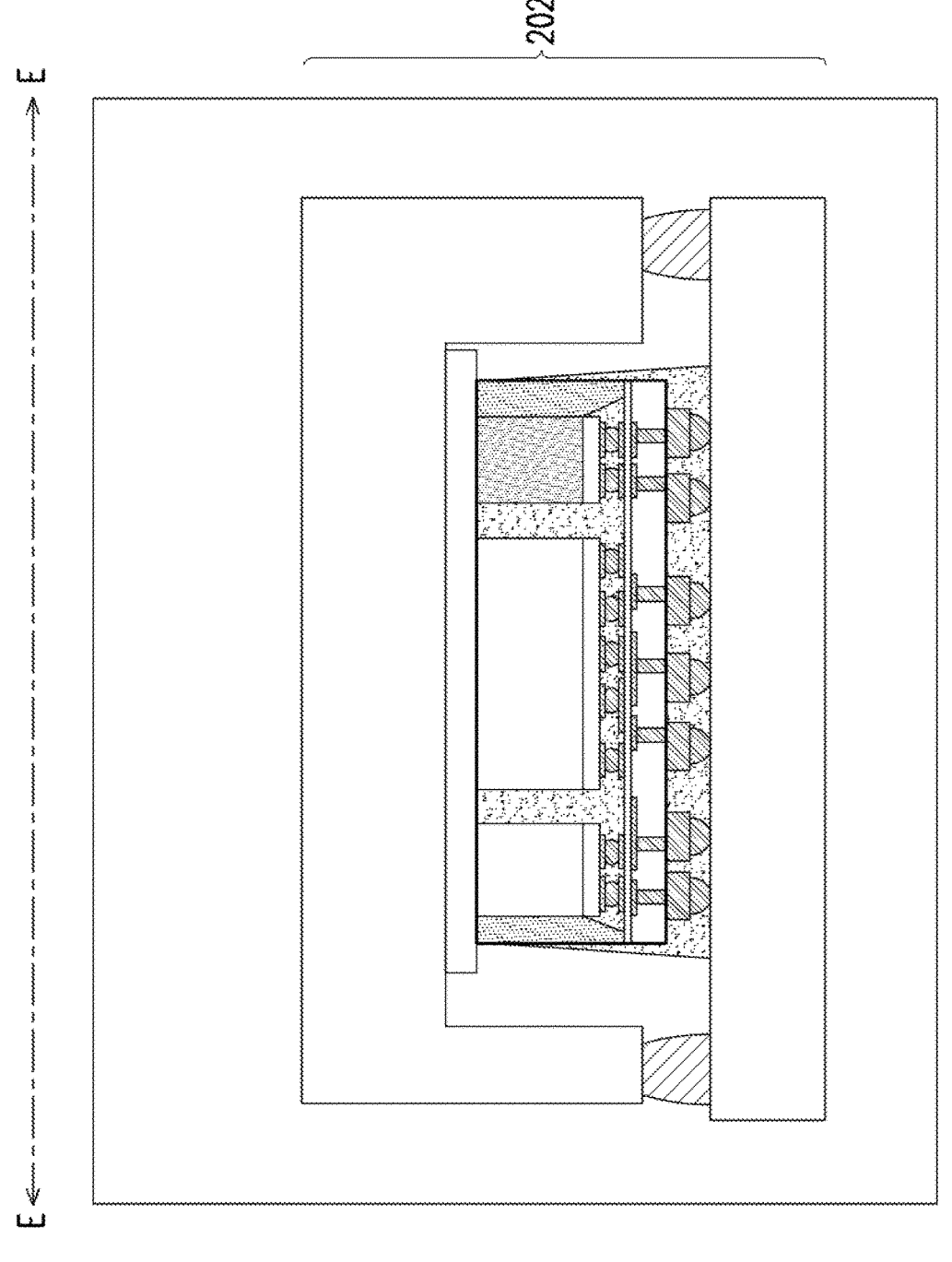

As shown in FIG. 8F, one or more tools of the of the semiconductor processing tool sets 105-150 may perform a series of operations 812 to cure the deposits 220 of the epoxy material (e.g., the fixture 202). For example, the curing tool (e.g., the furnace) of the PCB tool set 140 may cure the deposits 220 of the epoxy material to strengthen a bonding property of the deposits 220 of the epoxy material.

As indicated above, FIGS. 8A-8F are provided as an example. Other examples may differ from what is described with regard to FIGS. 8A-8F.

Figure 9:
FIG. 9 is a diagram of example components of a device described herein.

FIG. 9 is a diagram of example components of a device 900 described herein. In some implementations, one or more of the semiconductor processing tool sets 105-150 and/or the transport tool set 155 may include one or more devices 900 and/or one or more components of device 900. As shown in FIG. 9, device 900 may include a bus 910, a processor 920, a memory 930, an input component 940, an output component 950, and a communication component 960.

Bus 910 may include one or more components that enable wired and/or wireless communication among the components of device 900. Bus 910 may couple together two or more components of FIG. 9, such as via operative coupling, communicative coupling, electronic coupling, and/or electric coupling. Processor 920 may include a central processing unit, a graphics processing unit, a microprocessor, a controller, a microcontroller, a digital signal processor, a field-programmable gate array, an application-specific integrated circuit, and/or another type of processing component. Processor 920 is implemented in hardware, firmware, or a combination of hardware and software. In some implementations, processor 920 may include one or more processors capable of being programmed to perform one or more operations or processes described elsewhere herein.

Memory 930 may include volatile and/or nonvolatile memory. For example, memory 930 may include random access memory (RAM), read only memory (ROM), a hard disk drive, and/or another type of memory (e.g., a flash memory, a magnetic memory, and/or an optical memory). Memory 930 may include internal memory (e.g., RAM, ROM, or a hard disk drive) and/or removable memory (e.g., removable via a universal serial bus connection). Memory 930 may be a non-transitory computer-readable medium. Memory 930 stores information, instructions, and/or software (e.g., one or more software applications) related to the operation of device 900. In some implementations, memory 930 may include one or more memories that are coupled to one or more processors (e.g., processor 920), such as via bus 910.

Input component 940 enables device 900 to receive input, such as user input and/or sensed input. For example, input component 940 may include a touch screen, a keyboard, a keypad, a mouse, a button, a microphone, a switch, a sensor, a global positioning system sensor, an accelerometer, a gyroscope, and/or an actuator. Output component 950 enables device 900 to provide output, such as via a display, a speaker, and/or a light-emitting diode. Communication component 960 enables device 900 to communicate with other devices via a wired connection and/or a wireless connection. For example, communication component 960 may include a receiver, a transmitter, a transceiver, a modem, a network interface card, and/or an antenna.

Device 900 may perform one or more operations or processes described herein. For example, a non-transitory computer-readable medium (e.g., memory 930) may store a set of instructions (e.g., one or more instructions or code) for execution by processor 920. Processor 920 may execute the set of instructions to perform one or more operations or processes described herein. In some implementations, execution of the set of instructions, by one or more processors 920, causes the one or more processors 920 and/or the device 900 to perform one or more operations or processes described herein. In some implementations, hardwired circuitry is used instead of or in combination with the instructions to perform one or more operations or processes described herein. Additionally, or alternatively, processor 920 may be configured to perform one or more operations or processes described herein. Thus, implementations described herein are not limited to any specific combination of hardware circuitry and software.

The number and arrangement of components shown in FIG. 9 are provided as an example. Device 900 may include additional components, fewer components, different components, or differently arranged components than those shown in FIG. 9. Additionally, or alternatively, a set of components (e.g., one or more components) of device 900 may perform one or more functions described as being performed by another set of components of device 900.

Figure 10:
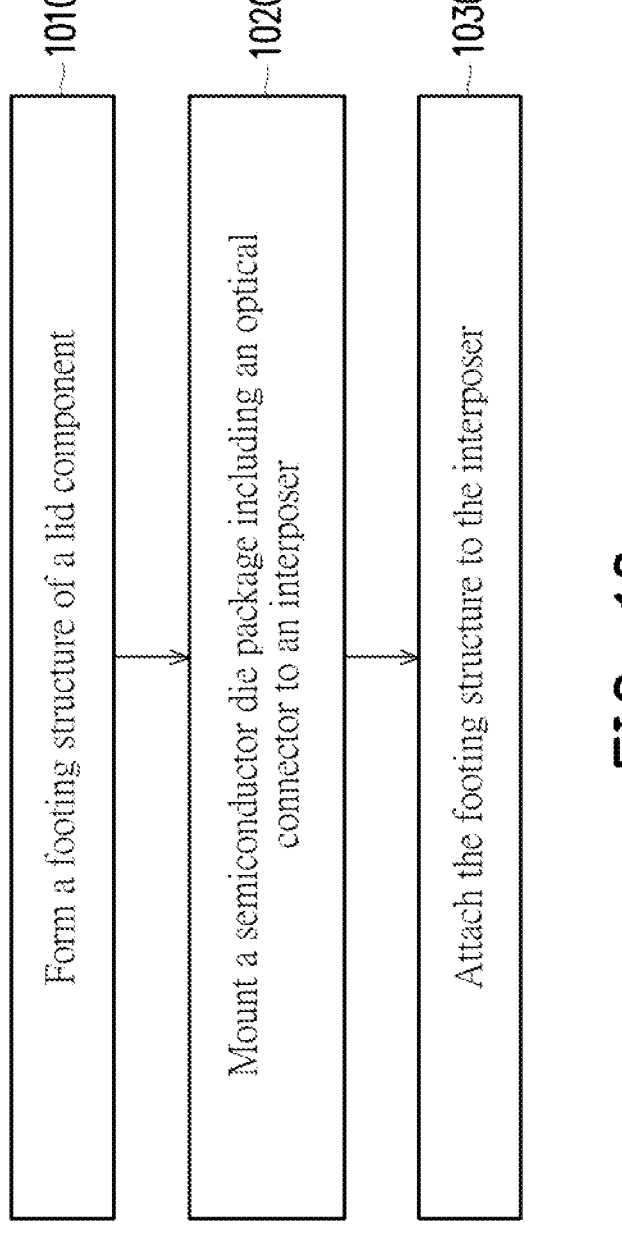
FIG. 10 is a flowchart of an example process associated with forming the fixture described herein.

FIG. 10 is a flowchart of an example process 1000 associated with forming a semiconductor die package. In some implementations, one or more process blocks of FIG. 10 are performed by one or more semiconductor processing tool sets (e.g., one or more of the semiconductor processing tool sets 105-150). Additionally, or alternatively, one or more process blocks of FIG. 10 may be performed by one or more components of device 900, such as processor 920, memory 930, input component 940, output component 950, and/or communication component 960.

As shown in FIG. 10, process 1000 may include forming a footing structure of a lid component (block 1010). For example, a tool such as a stamping tool or an injection molding tool may form a footing structure 218 of a lid component 214, as described above. In some implementations, forming the footing structure 218 includes forming one of a first portion (e.g., the footing structure 218d) including a first width (e.g., the width D5) along a first side of the lid component 214, and a second portion (e.g., the footing structure 218a) including a second width (e.g., the width D6) along a second side of the lid component 214 that is opposite the first side, where the second width is lesser relative to the first width, or more than one third portions (e.g., the footing structures 218b and 218c) along the first side of the lid component 214, and the second portion along the second side of the lid component 214.

As further shown in FIG. 10, process 1000 may include mounting a semiconductor die package including an optical connector to an interposer (block 1020). For example, a tool such as a pick-and place tool of the die-attach tool set 130 may mount a semiconductor die package 206 including an optical connector (e.g., the connector 208) to an interposer 204, as described above.

As further shown in FIG. 10, process 1000 may include attaching the footing structure to the interposer (block 1030). For example, a tool such the pick-and-place tool of the die-attach tool set 130 as may attach the footing structure 218 to the interposer 204, as described above. In some implementations, attaching the footing structure 218 to the interposer 204 positions a top structure 216 of the lid component 214 over the semiconductor die package 206.

Process 1000 may include additional implementations, such as any single implementation or any combination of implementations described below and/or in connection with one or more other processes described elsewhere herein.

In a first implementation, forming the footing structure 218 includes forming the first portion (e.g., the footing structure 218d) including the first width (e.g., the width D5) along the first side of the lid component 214 and the second portion (e.g., the footing structure 218a) including the second width (e.g., the width D6) along the second side of the lid component 214 that is opposite the first side. In some implementations, attaching the footing structure 218 to the interposer includes forming a first deposit (e.g., the deposit 220d) of an epoxy material on the interposer 204 that is proportional to the first width, forming a second deposit (e.g., the deposit 220a) of the epoxy material on the interposer 204 that is proportional to the second width, compressing the first portion of the footing structure into the first deposit of the epoxy material and the second portion of the footing structure into the second deposit of the epoxy material, and curing the first deposit of the epoxy material and the second deposit of the epoxy material.

In a second implementation, alone or in combination with the first implementation, process 1000 includes forming a thermal interface material 224 on a top surface of the semiconductor die package 206 prior to attaching the footing structure 218 to the interposer. In some implementations, attaching the footing structure 218 to the interposer 204 causes a compression of the thermal interface material 224 between the top surface of the semiconductor die package 206 the top structure 216 of the lid component 214. In some implementations, the first deposit (e.g., the deposit 220d) of the epoxy material and the second deposit (e.g., the deposit 220a) of the epoxy material retain the footing structure 218 to maintain the compression of the thermal interface material 224 between the top surface of the semiconductor die package 206 and the top structure 216 of the lid component 214.

In a third implementation, alone or in combination with one or more of the first and second implementations, forming the footing structure 218 includes forming the more than one third portions (e.g., the footing structures 218*b* and 218*c*) along the first side of the lid component 214 and the second portion (e.g., the footing structure 218*a*) along the second side of the lid component 214. In some implementations, attaching the footing structure 218 to the interposer 204 includes forming more than one deposits (e.g., the deposits 220*b* and 220*c*) of an epoxy material on the interposer 204, compressing the more than one third portions into the more than one deposits of the epoxy material, and curing the more than one deposits of the epoxy material.

In a fourth implementation, alone or in combination with one or more of the first through third implementations, process 1000 includes forming a thermal interface material 224 on a top surface of the semiconductor die package 206 prior to attaching the footing structure 218 to the interposer 204. In some implementations, attaching the footing structure 218 to the interposer 204 causes a compression of the thermal interface material 224 between the top surface of the semiconductor die package 206 and the top structure 216 of the lid component 214. In some implementations, the more than one deposits (e.g., the deposits 220*b* and 220*c*) of the epoxy material retain the more than one third portions (e.g., the footing structures 218*b* and 218*c*) of the footing structure 218 to maintain the compression of the thermal interface material 224 between the top surface of the semiconductor die package 206 and the top structure 216 of the lid component 214.

In a fifth implementation, alone or in combination with one or more of the first through fourth implementations, process 1000 includes mounting an IC device 226 to the interposer 204 between two of the more than one third portions (e.g., the footing structures 218*b* and 218*c*).

In a sixth implementation, alone or in combination with one or more of the first through fifth implementations, forming the lid component 214 includes forming an access port 222*a* through a top structure 216 of the lid component 214 to provide access to the optical connector (e.g., the connector 208).

In a seventh implementation, alone or in combination with one or more of the first through sixth implementations, forming the lid component 214 includes forming an access port 222*b* through a portion of the footing structure 218 (e.g., the footing structure 218*d*, or the footing structures 218*b* and 218*c*, among other examples) of the lid component 214 to provide access to the optical connector.

Although FIG. 10 shows example blocks of process 1000, in some implementations, process 1000 includes additional blocks, fewer blocks, different blocks, or differently arranged blocks than those depicted in FIG. 10. Additionally, or alternatively, two or more of the blocks of process 1000 may be performed in parallel.

Some implementations described herein provide techniques and apparatuses for a fixture including a semiconductor die package and methods of formation. The semiconductor die package is mounted to an interposer. In addition to the semiconductor die package, the fixture includes a lid component having a top structure and footing structures that connect the lid component to the interposer. The fixture includes a thermal interface material between a top surface of the semiconductor die package and the top structure of the lid component. The footing structures, connected to the interposer using deposits of an epoxy material, increase a structural rigidity of the fixture relative to another fixture not including the footing structures.

The increased structural rigidity of the fixture, in combination with retention forces provided by the deposits of the epoxy material, may reduce a warpage and maintain a position of one or more components of the fixture, including a position of a top structure of the lid component. In this way, compression of the thermal interface material between the top surface of the semiconductor die package and the top structure may be maintained to satisfy a thermal performance threshold of the fixture. Satisfying the thermal performance threshold may, in turn, result in the one or more IC dies within the semiconductor die package satisfying a circuitry performance threshold to be compatible with a computing application. Additionally, or alternatively, satisfying the thermal performance threshold may prolong a useful life of the semiconductor die package including the one or more IC dies.

As described in greater detail above, some implementations described herein provide a fixture. The fixture includes an interposer. The fixture includes a semiconductor die package that is mounted to the interposer and that includes a connector mounted to a substrate and an integrated circuit die mounted to the substrate. The fixture includes a lid component that is mounted to the interposer and that includes a top structure positioned above the semiconductor die package, an access port configured to provide access to the connector, and a footing structure, where the footing structure extends from an approximate perimeter of the lid component to the interposer, where a first section area of footing structure is adjacent to a first side of the connector, where the first section area includes a first width, where a second section area of the footing structure is adjacent to a second side of the connector that is opposite the first side, where the second section area includes a second width that is lesser relative to the first width, and where the connector, the integrated circuit die, the first section area of the footing structure, and the second section area of the footing structure are in line with one another.

As described in greater detail above, some implementations described herein provide a fixture. The fixture includes an interposer. The fixture includes a semiconductor die package that is mounted to the interposer and that includes a connector mounted to a substrate and an integrated circuit die mounted to the substrate adjacent to a first side of the connector. The fixture includes a lid component that is mounted to the interposer and that includes a top structure positioned above the semiconductor die package, an access port configured to provide access to the connector, a first footing structure extending from the top structure to the interposer, and a second footing structure extending from the top structure to the interposer, where the second footing structure is adjacent to a second side of the connector that is opposite the first side, and where the second footing structure is between the connector and the first footing structure.

As described in greater detail above, some implementations described herein provide a method. The method includes one of forming a footing structure of a lid component, where forming the footing structure includes forming a first portion including a first width along a first side of the lid component, and a second portion including a second width along a second side of the lid component that is opposite the first side, where the second width is greater relative to the first width or forming more than one third portions along the first side of the lid component and the second portion along the second side of the lid component. The method includes mounting a semiconductor die package including an optical connector to an interposer. The method includes attaching the footing structure to the interposer, where attaching the footing structure to the interposer positions a top structure of the lid component over the semiconductor die package.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fixture, comprising:
an interposer;
a semiconductor die package that is mounted to the interposer and comprising:
a connector mounted to a substrate; and
an integrated circuit die mounted to the substrate; and
a lid component that is mounted to the interposer and comprising:
a top structure positioned above the semiconductor die package;
an access port configured to provide access to the connector; and
a footing structure,
wherein the footing structure extends from an approximate perimeter of the lid component to the interposer,
wherein a first section area of the footing structure is adjacent to a first side of the connector,
wherein the first section area includes a first width,
wherein a second section area of the footing structure is adjacent to a second side of the connector that is opposite the first side,
wherein the second section area includes a second width that is less than the first width, and
wherein the connector, the integrated circuit die, the first section area of the footing structure, and the second section area of the footing structure are in line with one another.

2. The fixture of claim 1, wherein the access port passes through the top structure.

3. The fixture of claim 1, wherein the access port passes through the footing structure.

4. The fixture of claim 1, wherein a first deposit of an epoxy material that connects the footing structure adjacent to the first side of the connector to the interposer is proportional to the first width, and
wherein a second deposit of the epoxy material that connects the footing structure adjacent to the second side of the connector to the interposer is proportional to the second width.

5. The fixture of claim 4, further comprising:
a thermal interface material between a top surface of the semiconductor die package and the top structure of the lid component,
wherein a compression of the thermal interface material between the top surface of the semiconductor die package and the top structure of the lid component is maintained by a retention force provided by the first deposit of the epoxy material to the footing structure adjacent to the first side of the connector.

6. The fixture of claim 1, wherein the connector is for a fiber-optic cable.

7. A fixture, comprising:
an interposer;
a semiconductor die package that is mounted to the interposer and comprising:
a connector mounted to a substrate; and
an integrated circuit die mounted to the substrate adjacent to a first side of the connector; and
a lid component that is mounted to the interposer and comprising:
a top structure positioned above the semiconductor die package;
an access port configured to provide access to the connector;
a first footing structure extending from the top structure to the interposer; and
a second footing structure extending from the top structure to the interposer,
wherein the second footing structure is adjacent to a second side of the connector that is opposite the first side, and
wherein the second footing structure is between the connector and the first footing structure.

8. The fixture of claim 7, further comprising:
a semiconductor device mounted to the interposer between the first footing structure and the second footing structure.

9. The fixture of claim 7, further comprising:
an extension structure that connects the first footing structure and the second footing structure.

10. The fixture of claim 7, wherein the access port is a top access port passing through the top structure.

11. The fixture of claim 7, wherein the access port is a side access port passing through the first footing structure and the second footing structure.

12. The fixture of claim 7, further comprising:
a thermal interface material between a top surface of the semiconductor die package and the top structure of the lid component,
wherein a compression of the thermal interface material between the top surface of the semiconductor die package and the top structure of the lid component is maintained by a retention force provided by a first deposit of an epoxy material connecting the first footing structure to the interposer and a second deposit of the epoxy material connecting the second footing structure to the interposer.

13. A fixture, comprising:
a semiconductor die package mounted to an interposer, wherein the semiconductor die package comprises an optical connector; and
a footing structure of a lid component,
wherein the footing structure is attached to the interposer, and
wherein the footing structure comprises:
a first portion on a first side of the lid component, wherein the first portion has a first dimension along a direction; and
a second portion on a second side of the lid component that is opposite the first side,
wherein the second portion has a second dimension along the direction that is less than the first dimension.

14. The fixture of claim 13, wherein a top structure of the lid component is positioned over the semiconductor die package.

15. The fixture of claim 13, further comprising:

a first deposit of an epoxy material disposed between the interposer and the first portion; and a second deposit of the epoxy material disposed between the interposer and the second portion.

16. The fixture of claim 13, further comprising a thermal interface material on a top surface of the semiconductor die package, wherein the thermal interface material is disposed between the top surface of the semiconductor die package and a top structure of the lid component.

17. The fixture of claim 13, further comprising one or more integrated circuit devices mounted to the interposer, wherein the one or more integrated circuit devices are adjacent to at least one of the first portion or the second portion.

18. The fixture of claim 13, further comprising an access port through a top structure of the lid component.

19. The fixture of claim 13, further comprising an access port through a portion of the footing structure of the lid component.

20. The fixture of claim 13, wherein the semiconductor die package is between the first portion and the second portion.

<center>* * * * *</center>